United States Patent
Yamamoto et al.

(10) Patent No.: US 10,764,682 B2
(45) Date of Patent: Sep. 1, 2020

(54) PLAYBACK SYSTEM, CONTROL DEVICE, CONTROL METHOD, AND PROGRAM

(71) Applicant: Panasonic Intellectual Property Management Co., Ltd., Osaka (JP)

(72) Inventors: Masami Yamamoto, Osaka (JP); Tadayoshi Okuda, Osaka (JP); Yosuke Shiota, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/609,439

(22) PCT Filed: Apr. 20, 2018

(86) PCT No.: PCT/JP2018/016255
§ 371 (c)(1),
(2) Date: Oct. 29, 2019

(87) PCT Pub. No.: WO2018/211908
PCT Pub. Date: Nov. 22, 2018

(65) Prior Publication Data
US 2020/0092646 A1    Mar. 19, 2020

(30) Foreign Application Priority Data

May 17, 2017 (JP) .................................. 2017-098095

(51) Int. Cl.
*H04R 3/04* (2006.01)
*G06F 3/16* (2006.01)
(Continued)

(52) U.S. Cl.
CPC .............. *H04R 3/04* (2013.01); *G06F 3/165* (2013.01); *G10L 25/51* (2013.01); *H03G 3/24* (2013.01);
(Continued)

(58) Field of Classification Search
CPC .... H04R 3/04; H04R 29/001; H04R 2430/01; H03G 3/24; H03G 3/32; H03G 9/005; H03G 9/025; G06F 3/165; G10L 25/51
(Continued)

(56) References Cited

U.S. PATENT DOCUMENTS 4,628,526 A * 12/1986 Germer .................... H03G 3/32
381/108
5,581,621 A * 12/1996 Koyama ................. H04S 7/301
381/103
(Continued)

FOREIGN PATENT DOCUMENTS

| JP | 4581831 B | 11/2010 |
| JP | 5540224 B | 7/2014 |

OTHER PUBLICATIONS

International Search Report of PCT application No. PCT/JP2018/016255 dated Jul. 3, 2018.
(Continued)

*Primary Examiner* — Xu Mei
(74) *Attorney, Agent, or Firm* — McDermott Will & Emery LLP

(57) ABSTRACT

A control device includes a first communication circuit, a microphone, and a first control circuit. The first control circuit: acquires background noise in the room through the microphone and calculates a signal level of the background noise; transmits, to a playback device, a first control signal directing playback of a first test signal through a loudspeaker; acquires the first test signal through the microphone and calculates a signal level of the acquired first test signal; estimates a signal level of a second test signal using the signal level of the first test signal as a reference; increases a set value of a sound volume of the second test signal when a signal level obtained by subtracting a predetermined value from the estimated signal level of the second test signal is
(Continued)

less than or equal to the signal level of the background noise; transmits, to the playback device, a second control signal directing playback of the second test signal through the loudspeaker; acquires the second test signal through the microphone, calculates a frequency response of the room, and calculates a correction coefficient based on the calculated frequency response; and transmits a third control signal including the calculated correction coefficient to the playback device.

8 Claims, 23 Drawing Sheets

(51) Int. Cl.
*H04R 29/00* (2006.01)
*H03G 3/32* (2006.01)
*H03G 3/24* (2006.01)
*G10L 25/51* (2013.01)

(52) U.S. Cl.
CPC ............. *H03G 3/32* (2013.01); *H04R 29/001* (2013.01); *H04R 2430/01* (2013.01)

(58) Field of Classification Search
USPC ................ 381/57, 59, 95, 96, 104–107, 109
See application file for complete search history.

(56) References Cited

U.S. PATENT DOCUMENTS

| | | | | |
|---|---|---|---|---|
| 7,058,187 | B2* | 6/2006 | Ohta | H04S 7/301 381/101 |
| 7,155,362 | B2* | 12/2006 | Edwards | G01R 31/3271 702/124 |
| 7,158,643 | B2* | 1/2007 | Lavoie | H04S 7/301 381/303 |
| 7,489,784 | B2* | 2/2009 | Yoshino | H04S 7/301 381/103 |
| 9,031,268 | B2* | 5/2015 | Fejzo | H04R 5/02 381/303 |
| 9,036,825 | B2* | 5/2015 | Nackvi | H03G 5/165 381/66 |
| 9,419,575 | B2* | 8/2016 | Bush | H03G 3/32 |
| 9,930,470 | B2* | 3/2018 | Reilly | H04S 7/303 |
| 10,402,150 | B2* | 9/2019 | Aoki | H03G 9/005 |
| 2005/0053246 | A1* | 3/2005 | Yoshino | H04S 7/301 381/96 |
| 2008/0089522 | A1* | 4/2008 | Baba | H04S 7/305 381/17 |
| 2012/0166123 | A1 | 6/2012 | Hino et al. | |
| 2013/0315405 | A1 | 11/2013 | Kanishima et al. | |
| 2020/0092646 | A1* | 3/2020 | Yamamoto | H04R 3/04 |

OTHER PUBLICATIONS

The Extended European Search Report dated Apr. 29, 2020 for the related European Patent Application No. 18802286.7.

* cited by examiner

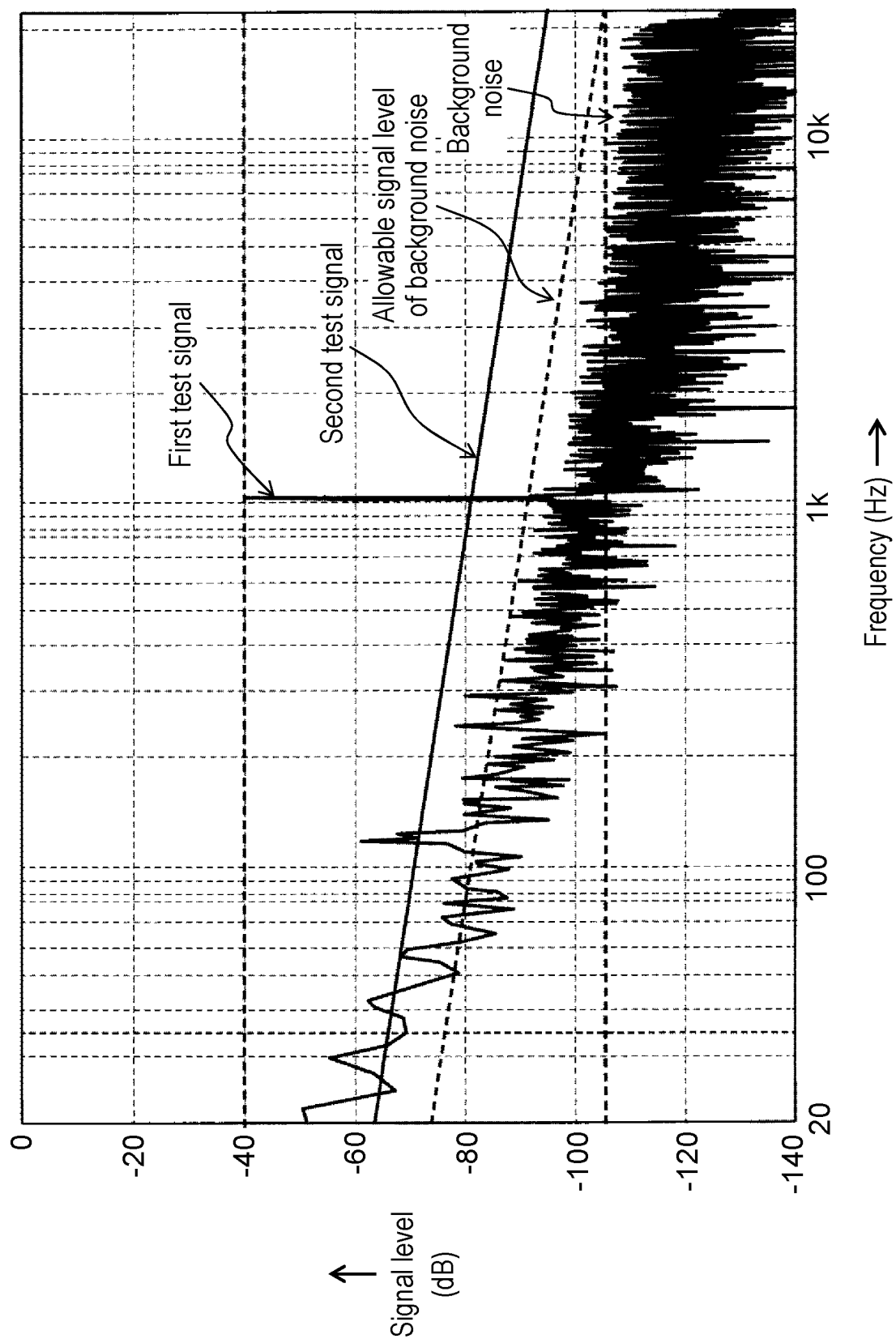

PLAYBACK SYSTEM, CONTROL DEVICE, CONTROL METHOD, AND PROGRAM

CROSS-REFERENCE TO RELATED APPLICATIONS

This application is a U.S. national stage application of the PCT International Application No. PCT/JP2018/016255 filed on Apr. 20, 2018, which claims the benefit of foreign priority of Japanese patent application No. 2017-098095 filed on May 17, 2017, the contents all of which are incorporated herein by reference.

TECHNICAL FIELD

The present disclosure relates to a control device that controls frequency characteristics of a playback device connected to or integrated with a loudspeaker which is installed in a room having predetermined acoustic characteristics, a playback system including the playback device and the control device, a control method for the playback device, and a program for the control device.

BACKGROUND ART

An audio device that plays back a sound signal such as music is usually installed for use in a room in a house. The audio device includes a loudspeaker and a playback device which is provided with one or more of a compact disc (CD) player, a media server device, and an amplifier. In the room where the audio device is installed, an installment position of the loudspeaker is limited according to a style of the room, a shape and arrangement position of furniture, and the like, or the position of a user listening to a sound played back by the audio device is changed. The acoustic characteristics, for example, frequency characteristics, of the sound output through the loudspeaker and reaching the ears of the user vary according to the style of the room, the shape and arrangement of furniture, and the like.

When a sound signal is played back by the audio device, it is desirable that an intended sound is provided to the user by the audio device with less influence on the sound due to the installment position of the loudspeaker in the room where the audio device is installed and the position of the user listening to the sound played back by the audio device. However, the intended sound may not be reproduced due to the style of the room where the audio device is installed, furniture, and the like.

There is a disclosure of a technique for measuring frequency characteristics of the room using a microphone which is specialized for measurement and which has known characteristics, and correcting frequency characteristics of a playback device based on the frequency characteristics of the room such that an intended sound reaches a user. Measurement of frequency characteristics needs arithmetic processing such as frequency analysis. An audio video (AV) amplifier having incorporated therein a high-performance digital signal processor (DSP) for executing such arithmetic processing has been commercialized.

For example, PTL 1 discloses a method and device for measuring an impulse response for measuring transmission characteristics of a measured system such as an acoustic device, an acoustic space, and a transmission line for an electric signal.

CITATION LIST

Patent Literature

PTL 1: Japanese Patent No. 5540224

SUMMARY

When frequency characteristics of a room are measured using a microphone specialized for measurement, a user needs to prepare the microphone each time he/she uses an audio device, which requires time and effort. Therefore, a technique capable of measuring frequency characteristics of a room with less effort has been demanded.

Further, when a signal level of a test signal for measuring frequency characteristics of a room is not sufficiently higher than a signal level of background noise in the room, accuracy of measurement of the frequency characteristics of the room may be decreased. Therefore, a measuring method less affected by background noise in the room has been demanded.

The present disclosure provides: a control device that measures frequency characteristics of a room with less effort than ever before while reducing an influence of background noise in the room, and controls frequency characteristics of a playback device; a playback system including the playback device and the control device; a control method for the playback device; and a program for the control device.

A control device according to one aspect of the present disclosure is a control device that controls frequency characteristics of a playback device that is connected to or integrated with a loudspeaker installed in a room. The control device is provided with a first communication circuit that communicates with the playback device, a microphone that acquires a sound signal generated through the loudspeaker, and a first control circuit. The first control circuit: acquires background noise in the room through the microphone and calculates a signal level of the background noise at a plurality of predetermined frequencies; transmits, to the playback device via the first communication circuit, a first control signal directing playback of a first test signal having a predetermined sound volume through the loudspeaker; acquires the first test signal through the microphone and calculates a signal level of the acquired first test signal; estimates a signal level of a second test signal having a predetermined sound volume and predetermined frequency characteristics at the plurality of predetermined frequencies using the signal level of the first test signal as a reference; increases a set value of the sound volume of the second test signal when a signal level obtained by subtracting a predetermined value from the estimated signal level of the second test signal is less than or equal to the signal level of the background noise in at least one of the plurality of predetermined frequencies; transmits, to the playback device via the first communication circuit, a second control signal directing playback of the second test signal having a sound volume corresponding to the set value through the loudspeaker; acquires the second test signal through the microphone, calculates a frequency response of the room based on the acquired second test signal, and calculates a correction coefficient of frequency characteristics to be set to the playback device based on the calculated frequency response of the room; and transmits, to the playback device via the first communication circuit, a third control signal including the correction coefficient of the frequency characteristics to be set to the playback device.

According to the present disclosure, frequency characteristics of the room can be measured with an influence of background noise in the room being reduced through adjustment of a playback sound volume of the second test signal using the first test signal. According to the present disclosure, any general-purpose device provided with a microphone, such as a smartphone, can be used as the control device, and thus the frequency characteristics of the room can be measured without using a measuring device such as a microphone specialized for measurement with less effort than ever before, and frequency characteristics of the playback device can be controlled.

BRIEF DESCRIPTION OF DRAWINGS

FIG. 23 is a graph illustrating another example of signal levels of the first test signal, the second test signal, and the background noise measured by the control device in the first exemplary embodiment.

DESCRIPTION OF EMBODIMENTS

Exemplary embodiments will now be described in detail with reference to the drawings as appropriate. However, unnecessarily detailed descriptions may be omitted. For example, a detailed description of well-known matters, and a duplicate description of substantially identical structures may not be provided. This is to avoid unnecessarily redundancy in the following description, and to facilitate understanding by those skilled in the art.

The accompanying drawings and the exemplary embodiments described below are provided for those skilled in the art to fully understand the present disclosure, and merely illustrate an example of the present disclosure. Numerical values, shapes, materials, constituent elements, arrangement positions and connection modes of the constituent elements, and the like described in the following exemplary embodiments are merely examples, and therefore are not intended to limit the subject matters of the claims. Further, among the constituent elements in the following exemplary embodiments, the constituent elements not recited in the independent claim indicating the broadest concept may be optionally added to the constituent elements recited in the independent claim.

The accompanying drawings do not necessarily reflect the actual scales, and are schematic diagrams that are simplified as appropriate for easy understanding of the present disclosure. In each of the drawings, substantially identical components are given identical reference marks, and descriptions of such components may be omitted or simplified.

First Exemplary Embodiment

Hereinafter, a playback device, a control device, and a program according to a first exemplary embodiment of the present disclosure will be described with reference to FIGS. 1 to 23.

[1-1. Configuration]

Figure 1:
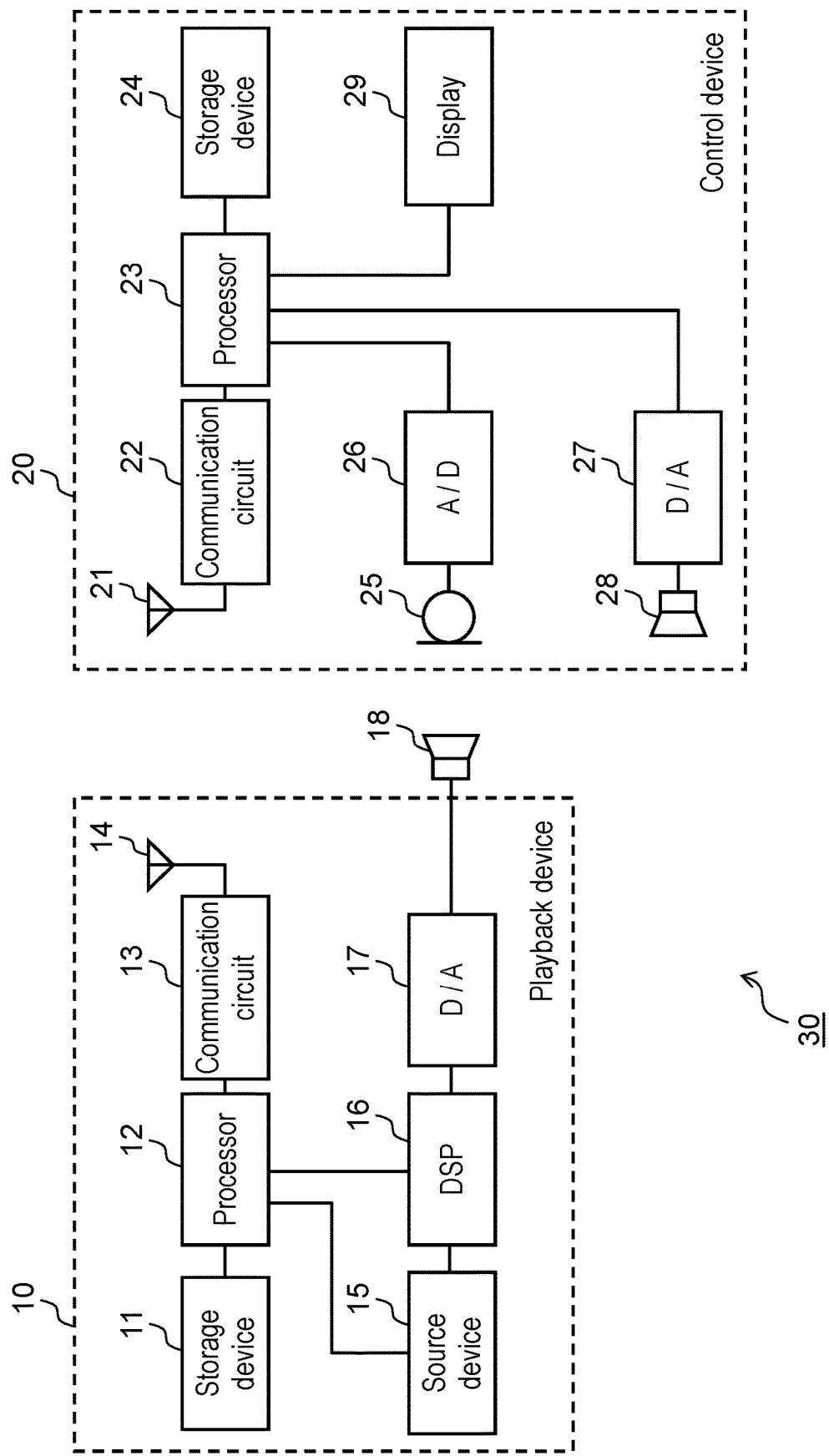
FIG. 1 is a block diagram schematically illustrating a configuration example of a playback system including a playback device and a control device according to a first exemplary embodiment.

FIG. 1 is a block diagram schematically illustrating a configuration example of playback system 30 including playback device 10 and control device 20 according to the first exemplary embodiment.

When playback system 30 is installed in a room, playback device 10, loudspeaker 18 connected to playback device 10, and control device 20, those of which are included in playback system 30, are installed in this room.

Control device 20 is, for example, a terminal device that can be carried by a user, such as a smartphone or a tablet computer, and disposed near the user carrying control device 20. The user is at any desired position when listening to a sound signal such as music played back through loudspeaker 18, and therefore, control device 20 is also disposed near this position.

In the present exemplary embodiment, control device 20 controls playback device 10 installed in the room to control frequency characteristics of a sound played back through loudspeaker 18 which is connected to or integrated with playback device 10. Hereinafter, a configuration example where a smartphone is used as control device 20 is described.

Playback device 10 includes storage device 11, processor 12, communication circuit 13, antenna 14, source device 15, digital signal processor (DSP) 16, and digital-to-analog (D/A) converter 17.

Storage device 11 stores set values and the like for DSP 16. Storage device 11 is, for example, a non-volatile storage medium such as a flash memory.

Processor 12 is a control circuit for entirely controlling the operation of playback device 10.

Communication circuit 13 wirelessly communicates with control device 20 via antenna 14.

Source device 15 is a source of generation of a sound signal (digital sound signal) such as music, and operates under the control of processor 12.

DSP 16 is a signal processing circuit that can vary frequency characteristics of the digital sound signal input to DSP 16 according to the set value (correction coefficient) set to DSP 16. DSP 16 operates under the control of processor 12 and performs a signal process on the digital sound signal input from source device 15 based on the set value (correction coefficient) stored in storage device 11. DSP 16 operates as a filter or a parametric equalizer, for example.

Digital-to-analog converter 17 converts the digital sound signal processed by DSP 16 into an analog sound signal, and outputs a sound or music (hereinafter merely referred to as a "sound" in some cases) based on the converted analog sound signal through loudspeaker 18.

Playback device 10 may be a device compliant with digital living network alliance (DLNA) (registered trademark) such as digital media player (DMP) or digital media renderer (DMR).

Control device 20 includes antenna 21, communication circuit 22, processor 23, storage device 24, microphone 25, analog-to-digital (A/D) converter 26, digital-to-analog (D/A) converter 27, loudspeaker 28, and display 29.

Communication circuit 22 wirelessly communicates with playback device 10 via antenna 21.

Processor 23 is a control circuit for entirely controlling the operation of control device 20.

Storage device 24 stores data necessary for processor 23 to execute a later-described acoustic correction process. Storage device 24 is, for example, a non-volatile storage medium such as a flash memory.

Microphone 25 converts the acquired sound into an analog sound signal and outputs the converted signal. For example, microphone 25 acquires a sound generated through loudspeaker 18 and converts the acquired sound into an analog sound signal.

Analog-to-digital converter 26 converts the analog sound signal acquired through microphone 25 into a digital sound signal, and outputs the converted digital sound signal to processor 23.

Digital-to-analog converter 27 converts the digital sound signal generated by processor 23 or the digital sound signal read from storage device 24 into an analog sound signal, and outputs a sound based on the converted analog sound signal through loudspeaker 28.

Display 29 is, for example, a display device such as a liquid crystal display device or an electro luminescence (EL) display device, and displays a still image or a moving image based on an image signal output from processor 23 or an image signal read from storage device 24. Further, display 29 has a touch panel integrated therewith, and thus, display 29 receives an input operation performed by a user via the touch panel and outputs a signal based on the input operation to processor 23. That is, display 29 is an input/output device capable of displaying an image and receiving an input operation performed by the user. Display 29 also display an image for a user interface by application software (a computer program for executing a later-described control method) executed by processor 23 during measurement of frequency characteristics, for example.

Now, an environment where playback system 30 illustrated in FIG. 1 is usable is described with reference to FIG. 2.

[1-2. Installation Example]

Figure 2:
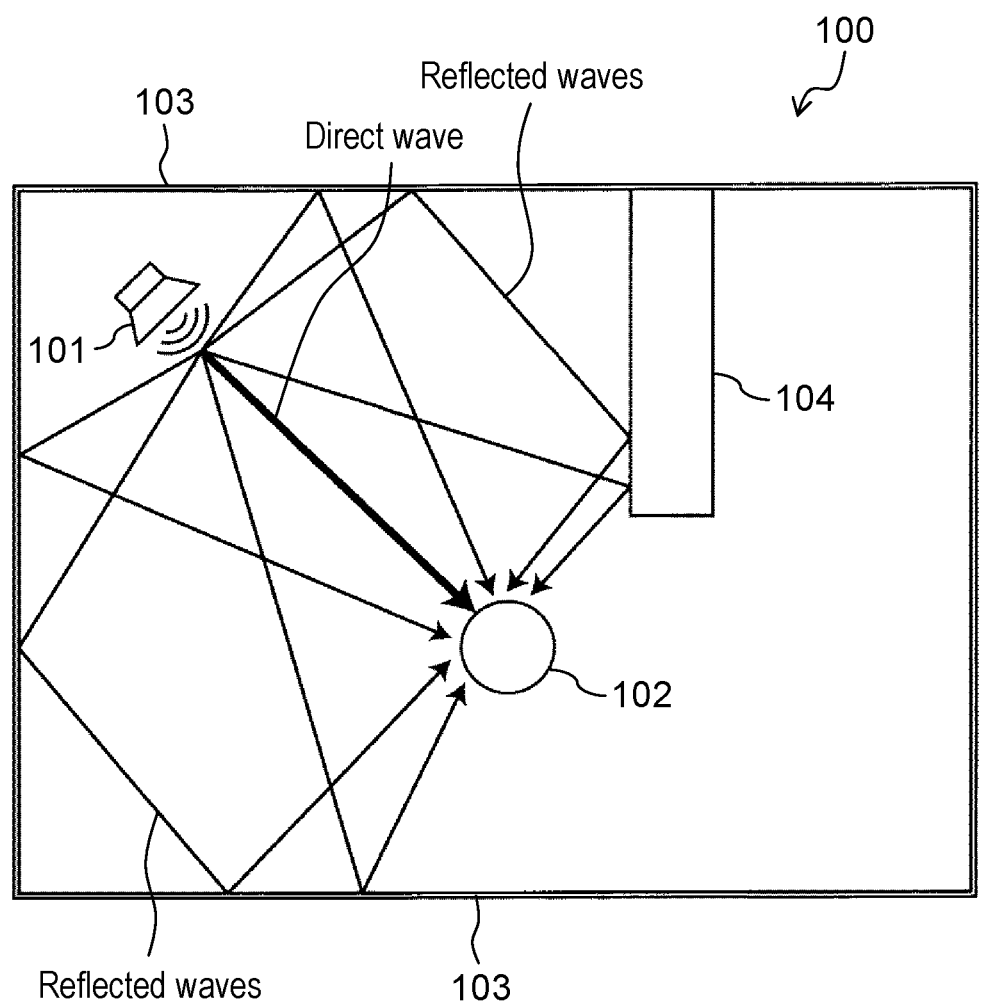
FIG. 2 is a view schematically illustrating an example of an environment where the playback system according to the first exemplary embodiment is usable.

FIG. 2 is a view schematically illustrating an example of an environment where playback system 30 according to the first exemplary embodiment is usable.

In the example illustrated in FIG. 2, in room 100, loudspeaker 101 is installed at a position near the corner of room 100, and user 102 listens to a sound output through loudspeaker 101 at a position distant from loudspeaker 101.

Note that loudspeaker 101 is substantially the same as loudspeaker 18 illustrated in FIG. 1. That is, loudspeaker 101 is connected to playback device 10 (not illustrated in FIG. 2).

Room 100 is a substantially closed space surrounded by wall 103, a floor, and a ceiling, and furniture 104 such as a chair, a table, and a shelf is in room 100. FIG. 2 illustrates only wall 103.

As illustrated by the arrows in FIG. 2, a sound output through loudspeaker 101 reaches the ears of user 102 as a synthetic sound including a sound by a direct wave (thick arrow) and a sound by many reflection waves (thin arrows). The direct wave (thick arrow) is a sound that is output through loudspeaker 101, advances to user 102, and directly reaches user 102. The reflection waves (thin arrows) are sounds which are output through loudspeaker 101, are reflected on wall 103, the floor, the ceiling, and furniture 104, and reach user 102. Therefore, in room 100 having many objects that reflect sounds, a propagation path of the sound reaching user 102 varies according to the installation position of loudspeaker 101 and the position of user 102, and thus, the frequency characteristics of the sound listened to by user 102 vary. Specifically, when at least one of the installation position of loudspeaker 101 and the position of user 102 changes, the frequency characteristics of the sound reaching the ears of user 102 vary due to an influence of reflected sounds, and positions of peaks and bottoms in the frequency characteristics of the sound vary.

[1-3. Outline]

There is a disclosure of a technique for measuring frequency characteristics of a room using a microphone specialized for measuring frequency characteristics, so as to correct frequency characteristics of a playback device, such as an audio device, based on the measurement result, in order to reproduce a sound with originally intended frequency characteristics with little variation in frequency characteristics caused by an environment where the playback device is installed. However, when the frequency characteristics of the playback device are corrected using this technique, the user needs to prepare the microphone specialized for measurement each time he/she uses the playback device. Therefore, if the frequency characteristics of the room can be measured using any general-purpose device provided with a microphone, such as a smartphone, without using a measuring device such as a microphone specialized for measurement, the convenience of the user using the playback system is improved.

A smartphone is originally a terminal device used for communication including a call and connection to network such as the Internet. Meanwhile, the smartphone is provided with a microphone, a high-definition display, a touch panel, a user-friendly user interface, a high-performance central processing unit (CPU), and the like. Therefore, the inventor of the present disclosure has examined the use of smartphone as a control device for measuring frequency characteristics.

The computational performance of a DSP mounted to an AV amplifier is, even through the DSP has high-performance, at most approximately 2.4 giga floating-point operations per second (GFLOPS). On the other hand, a smartphone has more excellent computational performance than such a DSP by more than one order of magnitude. Therefore, it is considered that the smartphone has computational performance enough for executing arithmetic processing necessary for measuring frequency characteristics of a room.

However, generally, the measurement of frequency characteristics of a room requires that the characteristics of a microphone to be used for the measurement are flat or the characteristics of the microphone are known. The microphone provided to the smartphone is designed to be used for a call, and therefore, its frequency characteristics are not flat, and a signal-to-noise ratio necessary for the measurement of frequency characteristics is not ensured. Therefore, it is unclear how background noise affects the measurement of frequency characteristics of a room, when the microphone provided to the smartphone is used for such measurement. For this reason, reduction of an influence of background noise in the room is demanded when frequency characteristics of the room are measured using any general-purpose device provided with a microphone, such as the smartphone.

Now, the way to address the foregoing problem by playback system 30 in the present exemplary embodiment is described.

Playback system 30 according to the present exemplary embodiment uses a first test signal and a second test signal which are played back through loudspeaker 18 by playback device 10 under the control of control device 20 when the frequency characteristics of the room are measured. Playback system 30 measures the frequency characteristics of the room using the second test signal. Before playing back the second test signal, playback system 30 determines a sound volume when the second test signal is played back through loudspeaker 18 (such a sound volume is also referred to as a "playback sound volume" hereinafter) using the first test signal. Playback system 30 reduces an influence of background noise in the room by adjusting the playback sound volume of the second test signal using the first test signal. In this way, playback system 30 can measure frequency characteristics of the room with less effort than ever before by using any general-purpose device provided with a microphone, such as the smartphone, without using a measuring device such as a microphone specialized for measurement.

Figure 3:
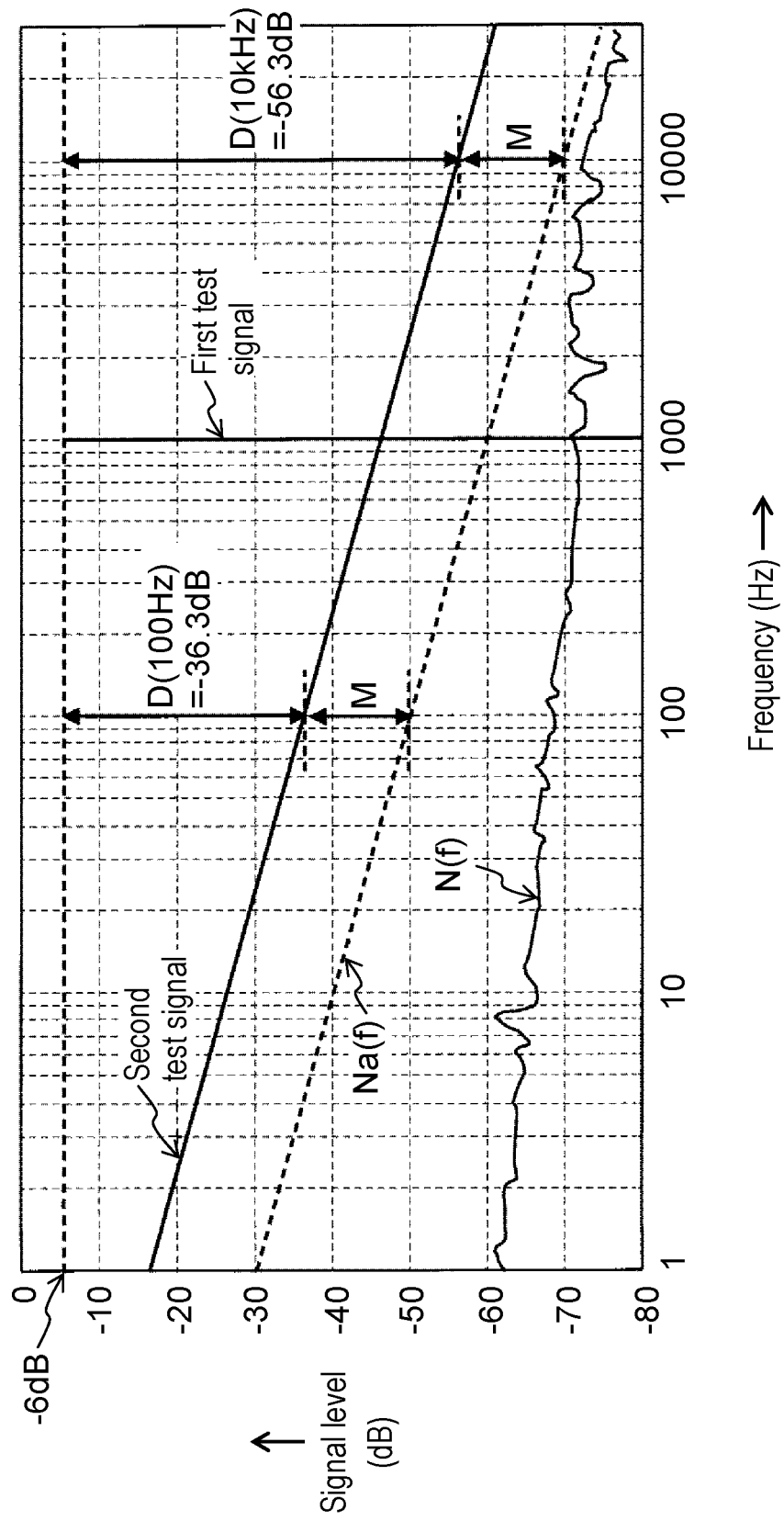
FIG. 3 is a graph for describing examples of a first test signal and a second test signal used by the playback device and the control device in the first exemplary embodiment.

FIG. 3 is a graph for describing examples of the first test signal and the second test signal used by playback device 10 and control device 20 in the first exemplary embodiment. In FIG. 3, a vertical axis represents a signal level and a horizontal axis represents a frequency.

FIG. 3 illustrates signal level N(f) of background noise acquired through microphone 25, a signal level of the first test signal which is played back through loudspeaker 18 and acquired through microphone 25, and a signal level of the second test signal calculated assuming that the second test signal is acquired through microphone 25 after being played back through loudspeaker 18.

Playback device 10 plays back the first test signal and the second test signal through loudspeaker 18 and outputs their playback sounds under the control of control device 20. It is to be noted that, in the present exemplary embodiment, playing back the first test signal (or the second test signal) and outputting its playback sound through loudspeaker 18 are also referred to as "playing back the first test signal (or the second test signal) through loudspeaker 18".

The first test signal has a predetermined sound volume (level). Further, the first test signal is, for example, a sine wave having a predetermined frequency (for example, 1 kHz). The first test signal is known to at least control device 20. The first test signal may be known or may not be known to playback device 10. When the first test signal is not known to playback device 10, control device 20 may notify playback device 10 of the first test signal.

The second test signal has a predetermined sound volume and predetermined frequency characteristics. The second test signal is known to at least control device 20. The second test signal may be known or may not be known to playback device 10. When the second test signal is not known to playback device 10, control device 20 may notify playback device 10 of the second test signal. The second test signal is, for example, a log-time stretched pulse (LOG-TSP) signal.

Figure 4:
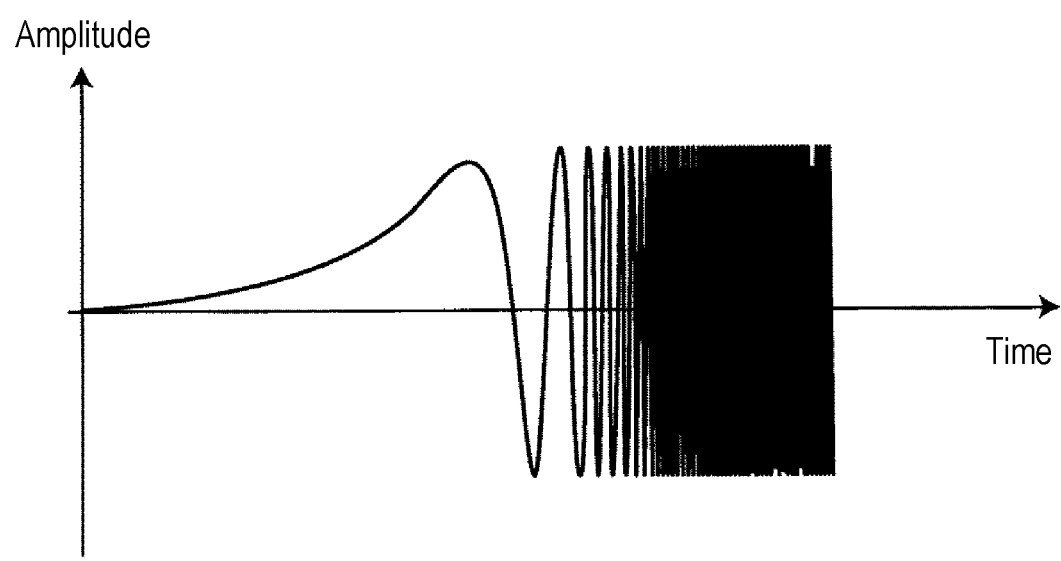
FIG. 4 is a graph illustrating an example of the second test signal usable by the playback device and the control device in the first exemplary embodiment.

FIG. 4 is a graph illustrating an example of the second test signal usable by playback device 10 and control device 20 in the first exemplary embodiment. The signal illustrated in FIG. 4 is the LOG-TSP signal.

Figure 5:
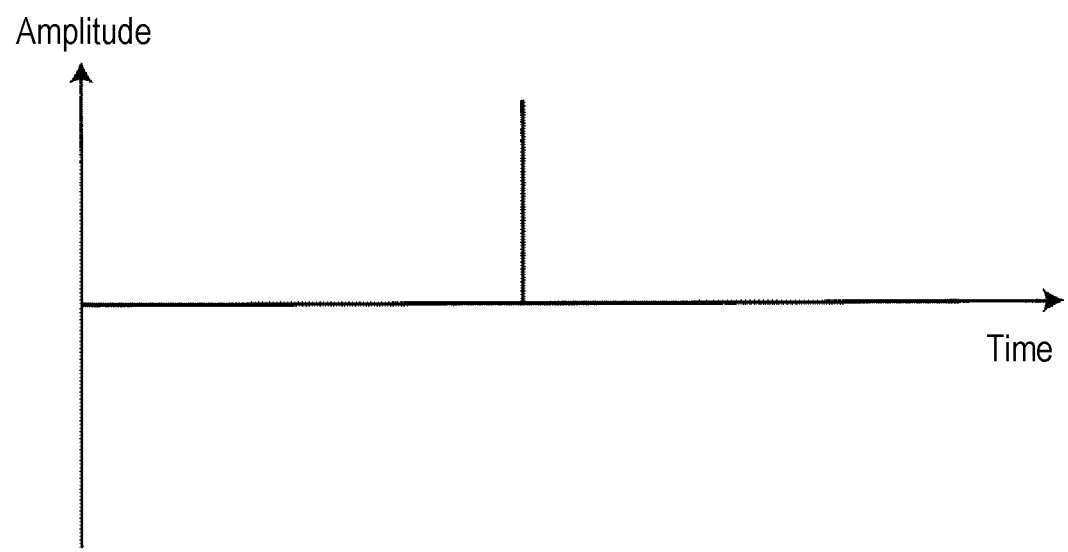
FIG. 5 is a graph illustrating a comparative example with the second test signal.

FIG. 5 is a graph illustrating a comparative example with the second test signal. The signal illustrated in FIG. 5 is an impulse signal. In FIGS. 4 and 5, a vertical axis represents an amplitude and a horizontal axis represents a time.

The impulse signal has a plurality of frequency components, but has a relatively short duration time and relatively small energy. Therefore, it is difficult to sufficiently increase the signal level of the respective frequency components in the impulse signal, and thus, it is difficult to obtain a satisfactory signal-to-noise ratio from the impulse signal. There has been known a time stretched pulse (TSP) signal which has relatively large energy by stretching the impulse signal in the time axis direction. In the TSP signal, a frequency varies, with time, from a low frequency to a high frequency or from a high frequency to a low frequency. Like the impulse signal, the TSP signal is usable for measuring frequency characteristics (impulse response) of any optional system.

The second test signal is used for measuring the frequency characteristics of the room. In the present exemplary embodiment, a sound wave is used for measuring the frequency characteristics of the room, and therefore, the second test signal may have linear frequency characteristics in a graph in which a horizontal axis has a logarithmic scale as illustrated in FIG. 3. The second test signal may have a constant signal level in a frequency region. In the second test signal, frequency components different from each other may have the same signal level. Further, the first test signal and the second test signal may have the same signal level in a time domain. By using a LOG-TSP signal as the second test signal, playback system 30 can measure the frequency characteristics of the room while ensuring a satisfactory signal-to-noise ratio throughout the entire frequency band that can be played back by playback device 10.

In playback system 30, the first test signal (a digital signal generated as the first test signal) may be stored in storage device 11 of playback device 10, or the first test signal stored in storage device 24 of control device 20 may be transmitted to playback device 10 from control device 20. The second test signal (a digital signal generated as the second test signal) may be stored in storage device 11 of playback device 10, or the second test signal stored in storage device 24 of control device 20 may be transmitted to playback device 10 from control device 20.

The first test signal is used for determining a sound volume when the second test signal is played back through loudspeaker 18 as described below.

[1-4. Operation]

The operations of playback device 10 and control device 20 are described with reference to FIGS. 1 and 3.

Processor 23 in control device 20 acquires background noise in the room through microphone 25, and calculates signal level N(f) of the background noise at a plurality of predetermined frequencies f. In the following description, the plurality of predetermined frequencies f is defined as 100 Hz and 10 kHz, for example. Signal level N(f) of the background noise may be calculated as a maximum value of the signal level within ⅓ octave, ⅔ octave, or 1 octave near frequency f, for example.

Processor 23 in control device 20 transmits a first control signal to playback device 10 via communication circuit 22 and antenna 21. The first control signal is a control signal that directs playback device 10 to play back the first test signal having a predetermined sound volume through loudspeaker 18.

Processor 12 in playback device 10 receives the first control signal transmitted from control device 20 via antenna 14 and communication circuit 13. Processor 12 in playback device 10 then plays back the first test signal having a predetermined sound volume through loudspeaker 18 based on the received first control signal.

Processor 23 in control device 20 acquires the first test signal output through loudspeaker 18 and reaching control device 20 through microphone 25.

Processor 23 in control device 20 then calculates signal level T1 of the acquired first test signal. In the example illustrated in FIG. 3, signal level T1 of the first test signal is −6 dB.

Then, processor 23 in control device 20 estimates signal level $T2(f)$ of the second test signal, assuming that the second test signal having a predetermined sound volume and predetermined frequency characteristics is played back through loudspeaker 18 and acquired through microphone 25. When doing so, processor 23 in control device 20 estimates signal level $T2(f)$ of the second test signal at the plurality of predetermined frequencies f (for example, f=100 Hz and 10 kHz) based on signal level T1 of the acquired first test signal. As illustrated in FIG. 3, processor 23 in control device 20 estimates difference $D(f)=T1-T2(f)$ between signal level T1 of the acquired first test signal and signal level $T2(f)$ of the second test signal at the plurality of predetermined frequencies f (for example, f=100 Hz and 10 kHz). The sound volumes and frequency characteristics of the first test signal and the second test signal are known to processor 23 in control device 20. Therefore, processor 23 in control device 20 can estimate D(f) using the known information items (for example, difference in audio volume between the first test signal and the second test signal, difference in audio volume between a low-frequency region and a high-frequency region of the second test signal, etc.) and using signal level T1 of the acquired first test signal as a reference, thereby being capable of estimating signal level $T2(f)$ of the second test signal based on estimated D(f).

Processor 23 in control device 20 compares estimated signal level $T2(f)$ of the second test signal with signal level N(f) of the background noise at the plurality of predetermined frequencies f (for example, f=100 Hz and 10 kHz).

Specifically, processor 23 in control device 20 calculates allowable signal level $Na(f)=T1-D(f)-M$ of the background noise by subtracting predetermined measurement margin M from estimated signal level $T2(f)=T1-D(f)$ of the second test signal.

Measurement margin M is zero or a predetermined positive number, and is set in consideration of a variation in frequency characteristics of the first test signal and the second test signal acquired by control device 20, for example.

Processor 23 in control device 20 then compares allowable signal level Na(f) of the background noise and signal level N(f) of the background noise at the plurality of predetermined frequencies f (for example, f=100 Hz and 10 kHz).

When allowable signal level Na(f) of the background noise is greater than signal level N(f) of the background noise at all of the predetermined frequencies f, processor 23 in control device 20 determines that the second test signal may have a sound volume in a level based on the current set value, and maintains the current set value set as the sound volume of the second test signal.

On the other hand, when allowable signal level Na(f) of the background noise is less than or equal to signal level N(f) of the background noise in at least one of the predetermined frequencies f (for example, f=100 Hz and 10 kHz), processor 23 in control device 20 determines that, if the second test signal is played back with the sound volume based on the current set value, the frequency characteristics of the room may not be accurately measured due to the influence of the background noise. Therefore, in such a case, processor 23 in control device 20 increases the set value of the sound volume of the second test signal from the current set value.

As illustrated in FIG. 3, the gain of the second test signal is relatively high in a low-frequency region where the frequency is relatively low, and thus, the background noise level in the low-frequency region may be higher than the background noise level in a high-frequency region where the frequency is relatively high.

When signal level T1 of the first test signal exceeds a predetermined threshold (for example, −6 dB), signal level T1 may be saturated (clipped). In such a case, processor 23 in control device 20 determines that, if the second test signal is played back with the sound volume based on the current set value, the sound volume of the second test signal is too large, and the frequency characteristics of the room may not be accurately measured. Therefore, in such a case, processor 23 in control device 20 decreases the set value of the sound volume of the second test signal from the current set value.

Processor 23 in control device 20 transmits a second control signal to playback device 10 via communication circuit 22 and antenna 21. The second control signal is a control signal that directs playback device 10 to play back the second test signal having a sound volume according to the set value through loudspeaker 18.

Processor 12 in playback device 10 receives the second control signal transmitted from control device 20 via antenna 14 and communication circuit 13. Processor 12 in playback device 10 then plays back the second test signal having the sound volume according to the set value through loudspeaker 18 based on the received second control signal.

Processor 23 in control device 20 acquires, through microphone 25, the second test signal which is output through loudspeaker 18 and reaches control device 20 as a synthetic sound including a sound by direct waves and a sound by many reflection waves. Processor 23 in control device 20 then calculates a frequency response in the room based on the acquired second test signal. Processor 23 in control device 20 then calculates a correction coefficient of frequency characteristics to be set to playback device 10 based on the calculated frequency response in the room.

Processor 23 in control device 20 transmits a third control signal to playback device 10 via communication circuit 22 and antenna 21. The third control signal is a control signal including the correction coefficient of frequency characteristics to be set to playback device 10.

Processor 12 in playback device 10 receives the third control signal transmitted from control device 20 via antenna 14 and communication circuit 13. Processor 12 in playback device 10 then sets the correction coefficient included in the received third control signal to DSP 16 based on the received third control signal. DSP 16 performs a signal process (for correcting the frequency characteristics) based on the set correction coefficient on the digital sound signal input to DSP 16, and outputs the resultant sound signal. In this way, playback device 10 corrects the frequency characteristics of the sound signal played back by playback device 10, that is, the frequency characteristics of the sound played back through loudspeaker 18.

As described above, playback system 30 according to the present exemplary embodiment can measure frequency characteristics of the room while reducing an influence of background noise in the room, through adjustment of the playback sound volume of the second test signal using the first test signal, and control the frequency characteristics of the sound played back through loudspeaker 18 connected to playback device 10 based on the measurement result. Accordingly, playback system 30 can use any general-purpose device provided with a microphone, such as the smartphone, as control device 20, and thus the frequency characteristics of the room can be measured without using a measuring device such as a microphone specialized for measurement with less effort than ever before.

Playback system 30 calculates the correction coefficient of the frequency characteristics based on the frequency characteristics of the room thus measured, and sets the calculated correction coefficient to DSP 16 in playback device 10. DSP 16 corrects the frequency characteristics of the sound signal input to DSP 16 based on the correction coefficient. Thus, playback device 10 can output, through loudspeaker 18 connected to playback device 10, the playback sound which has been appropriately corrected according to the position of loudspeaker 18 and the position of user 102 in the room where playback system 30 is installed.

[1-5. Flowchart]

Referring now to FIGS. 6 to 17, the operations of playback device 10 and control device 20 in the present exemplary embodiment will be described in detail. First, the outline of an acoustic correction process executed mainly by processor 23 in control device 20 will be described with reference to the flowchart in FIG. 6. Then, each step in FIG. 6 will be described in detail with reference to flowcharts in FIGS. 7 to 12. In addition, the communication performed between playback device 10 and control device 20 will be described with reference to sequence diagrams in FIGS. 13 and 14, as appropriate. The acoustic correction process by playback system 30 is started when user 102 performs an operation to instruct control device 20 to start the acoustic correction operation, for example.

Figure 6:
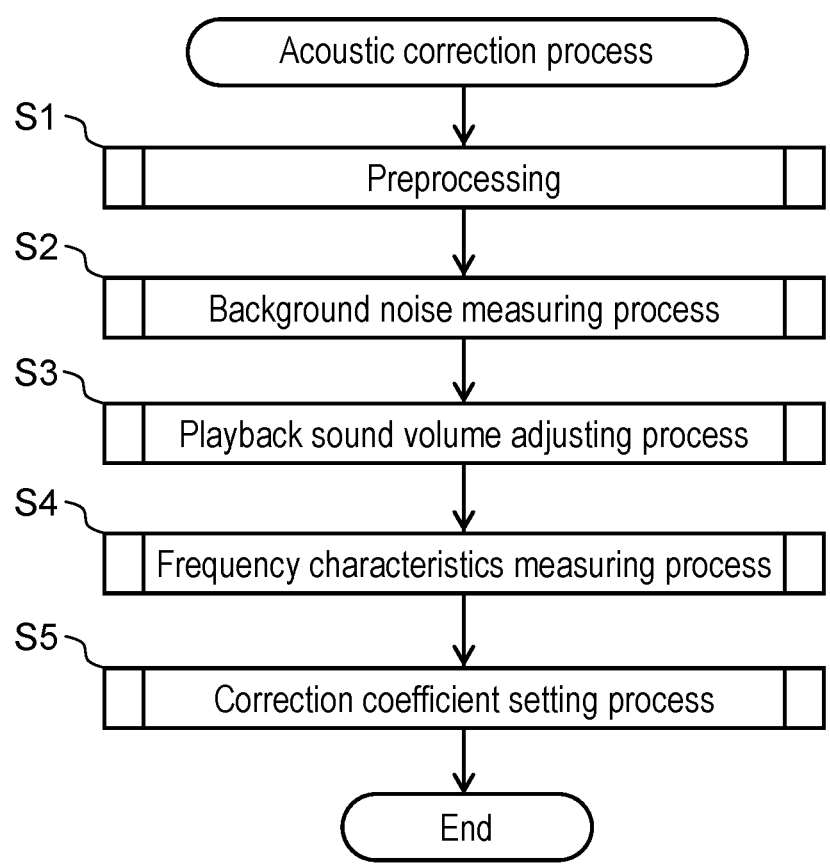
FIG. 6 is a flowchart illustrating an example of an acoustic correction process executed by a processor in the control device in the first exemplary embodiment.

FIG. 6 is a flowchart illustrating an example of the acoustic correction process executed by processor 23 in control device 20 in the first exemplary embodiment.

As illustrated in the flowchart in FIG. 6, processor 23 in control device 20 executes preprocessing including various steps for preparation of the acoustic correction process (step S1).

Processor 23 in control device 20 then executes a background noise measuring process for measuring background noise in the room (step S2).

Then, processor 23 in control device 20 executes a playback sound volume adjusting process (step S3). The playback sound adjusting process is for adjusting a playback sound volume of the second test signal using the first test signal.

Then, processor 23 in control device 20 executes a frequency characteristics measuring process (step S4). The frequency characteristics measuring process is a process for measuring the frequency characteristics of the room using the second test signal and calculating a correction coefficient of frequency characteristics to be set to playback device 10 based on the measurement result.

Processor 23 in control device 20 finally executes a correction coefficient setting process for setting the correction coefficient calculated in step S4 to playback device 10 (step S5).

Now, the detail of the preprocessing (step S1) illustrated in FIG. 6 will be described with reference to the flowchart in FIG. 7.

Figure 7:
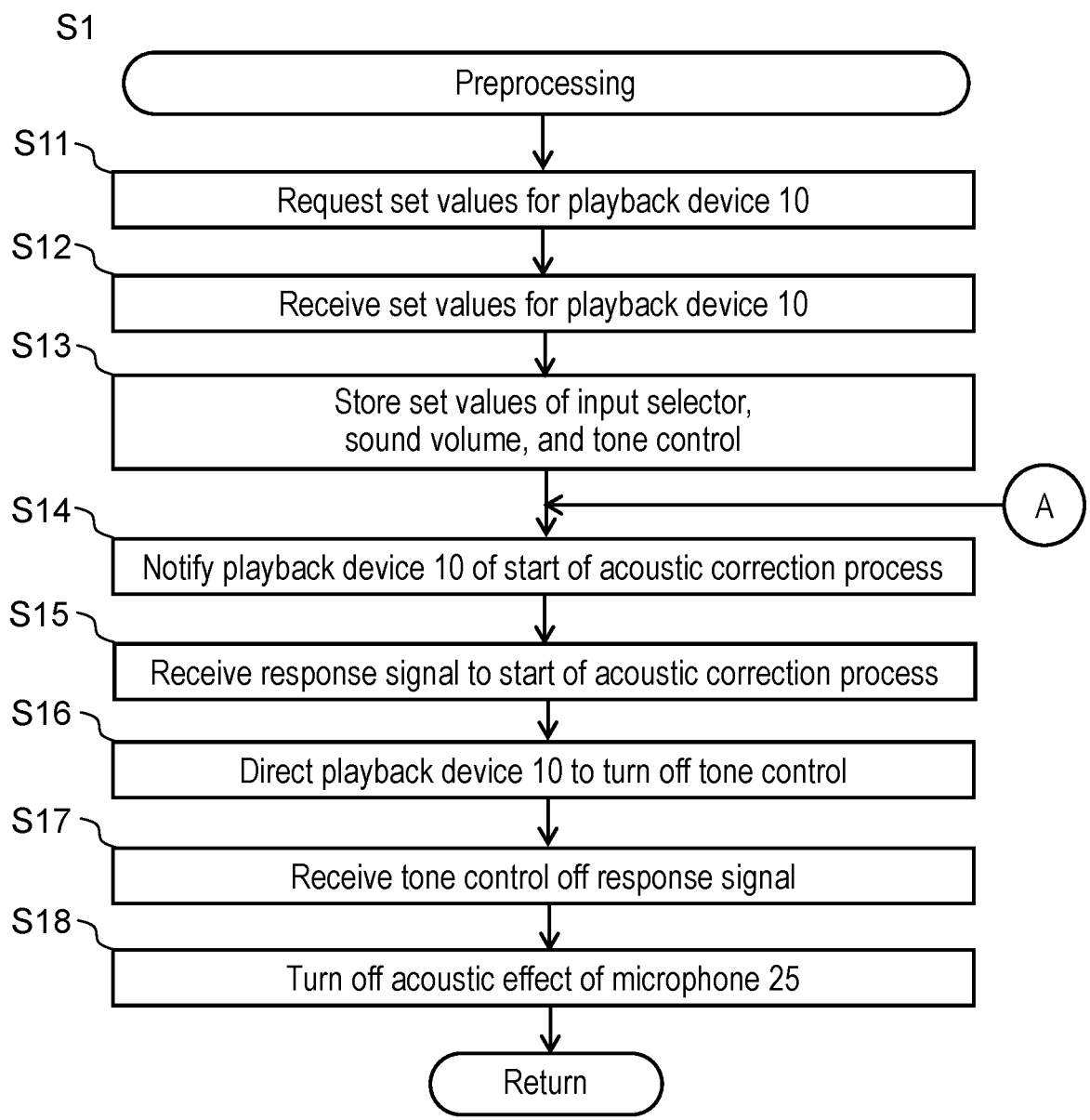
FIG. 7 is a flowchart illustrating an example of a subroutine of preprocessing (step S1) illustrated in FIG. 6.

FIG. 7 is a flowchart illustrating an example of a subroutine of the preprocessing (step S1) illustrated in FIG. 6.

In the preprocessing (step S1), processor 23 in control device 20 firstly transmits a signal (set value request signal) requesting set values for playback device 10 to playback device 10 via communication circuit 22 and antenna 21 (step S11), as illustrated in the flowchart in FIG. 7. The set values for playback device 10 include set values of an input selector, a sound volume, and tone control, for example.

Processor 12 in playback device 10 receives the set value request signal transmitted from control device 20 in step S11 via antenna 14 and communication circuit 13. Processor 12 in playback device 10 transmits a signal (set value response signal) including the set values of the input selector, the sound volume, and the tone control of playback device 10 to control device 20 via communication circuit 13 and antenna 14 in response to a set value request indicated by the received request signal.

Processor 23 in control device 20 receives the response signal of the set values for playback device 10 transmitted from playback device 10 via antenna 21 and communication circuit 22 (step S12).

When unable to receive the set value response signal from playback device 10 in step S12 due to the reason such as a power source of playback device 10 being turned off, processor 23 in control device 20 may display, in display 29, an error message indicating that the response signal cannot be received. Also, processor 23 in control device 20 may subsequently end the process.

Processor 23 in control device 20 that receives the set value response signal transmitted from playback device 10 in step S12 extracts, from the response signal, the set values of the input selector, the sound volume, and the tone control for playback device 10, and stores the extracted values in storage device 24 in control device 20 (step S13).

Processor 23 in control device 20 then transmits a signal (a notification signal indicating start of the acoustic correction process) notifying playback device 10 of the start of the acoustic correction process to playback device 10 via communication circuit 22 and antenna 21 (step S14).

Processor 12 in playback device 10 receives the notification signal indicating the start of the acoustic correction process transmitted from control device 20 in step S14 via antenna 14 and communication circuit 13. Processor 12 in playback device 10 transmits a signal (a response signal to the start of the acoustic correction process) responding to the received notification signal to control device 20 via communication circuit 13 and antenna 14.

Processor 23 in control device 20 receives, via antenna 21 and communication circuit 22, the response signal to the start of the acoustic correction process transmitted from playback device 10 (step S15).

Processor 23 in control device 20 may repeat the operation for transmitting the notification signal indicating the start of the acoustic correction process to playback device 10 a predetermined number of times (for example, three times) until receiving a response signal to the notification signal from playback device 10. When control device 20 does not receive the response signal to the notification signal from playback device 10 despite the predetermined number of times of executions (for example, three times of executions) of the operation for transmitting the notification signal to playback device 10, control device 20 may display, in display 29, an error message indicating that control device 20 cannot receive the response signal. Also, control device 20 may subsequently end the process.

Processor 23 in control device 20 determines whether tone control is set to playback device 10 based on the set value of the tone control included in the set value response signal received in step S12. When the tone control is set to playback device 10, processor 23 in control device 20 transmits a signal (tone control off instruction signal) directing playback device 10 to turn off the tone control of playback device 10 to playback device 10 via communication circuit 22 and antenna 21 (step S16).

Processor 12 in playback device 10 receives the tone control off instruction signal transmitted from control device 20 in step S16 via antenna 14 and communication circuit 13. Processor 12 in playback device 10 turns off the tone control according to the received instruction signal, and then, transmits a signal (tone control off response signal) indicating that the tone control is turned off to control device 20 via communication circuit 13 and antenna 14.

Processor 23 in control device 20 receives, via antenna 21 and communication circuit 22, the tone control off response signal transmitted from playback device 10 (step S17).

Processor 23 in control device 20 may repeat the operation for transmitting the signal directing turn-off of the tone control to playback device 10 a predetermined number of times (for example, three times) until receiving a response signal to the instruction signal from playback device 10. When control device 20 does not receive the response signal to the instruction signal from playback device 10 despite the predetermined number of times of executions (for example, three executions) of the operation for transmitting the instruction signal to playback device 10, control device 20 may display, in display 29, an error message indicating that control device 20 cannot receive the response signal. Also, control device 20 may subsequently end the process.

Then, processor 23 in control device 20 turns off an acoustic effect of microphone 25 (step S18).

When control device 20 is a smartphone, the microphone provided to the smartphone is designed to be used for a call, and thus has non-flat frequency characteristics. Also, the smartphone may have frequency characteristics in which a high-frequency region is emphasized for allowing a consonant in a sound to be easy to hear, or may be subjected to a low-frequency region cut-off filter process for reducing noise in a low-frequency region caused by wind noise. Further, the smartphone may be subjected to automatic gain control or noise reduction in some cases. In playback system 30 in the present exemplary embodiment, the acoustic effects described above are all turned off when the acoustic correction process is executed.

Next, communication performed in steps S11 to S17 between playback device 10 and control device 20 will be described with reference to the sequence diagram in FIG. 13.

Figure 13:
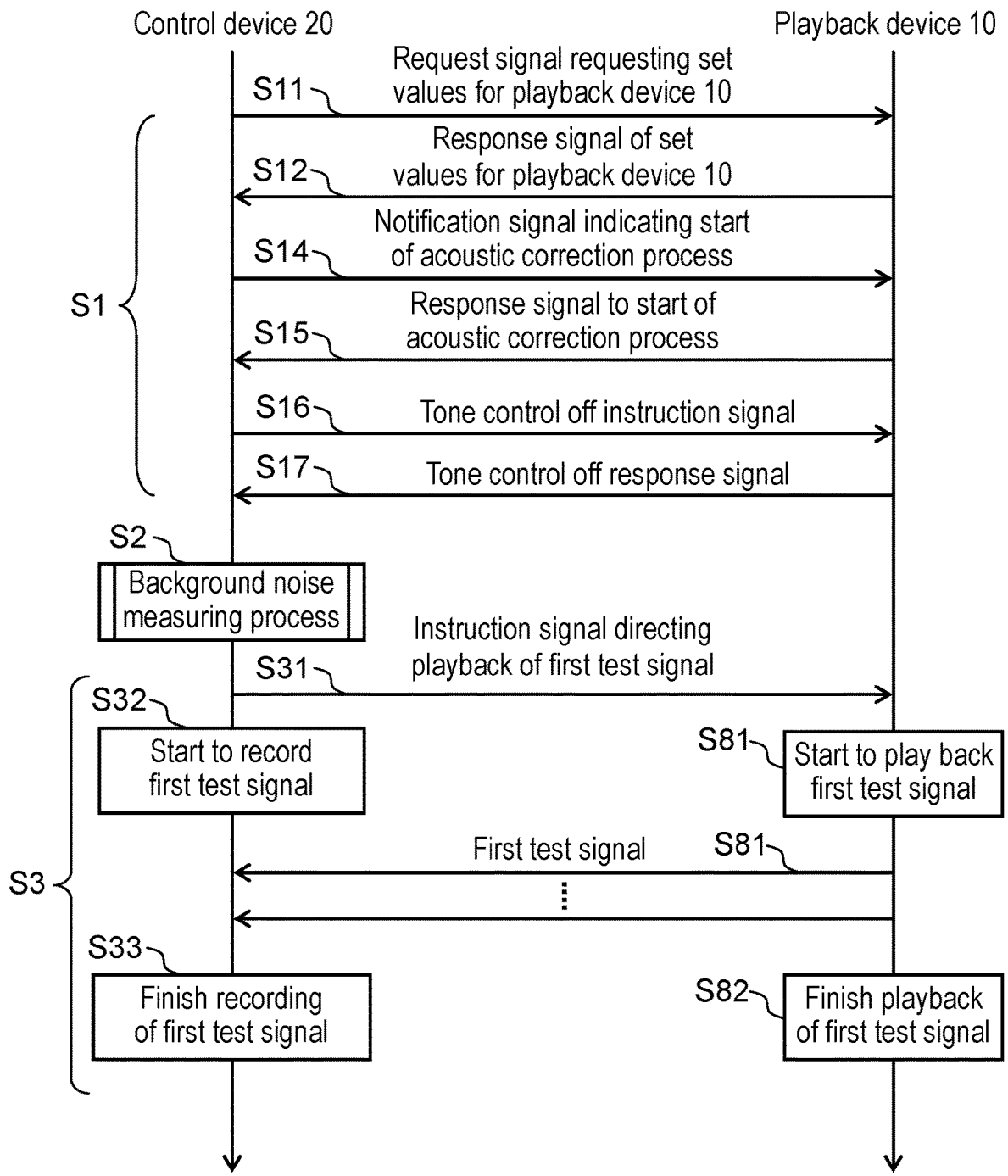
FIG. 13 is a sequence diagram illustrating an example of communication performed between the playback device and the control device in the first exemplary embodiment when processes in steps S1 to S3 illustrated in FIG. 6 are executed.

FIG. 13 is a sequence diagram illustrating an example of communication performed between playback device 10 and control device 20 in the first exemplary embodiment when the processes in steps S1 to S3 illustrated in FIG. 6 are executed.

As illustrated in FIG. 13, control device 20 transmits the signal (set value request signal) for requesting the set values for playback device 10 to playback device 10 (step S11).

Playback device 10 receiving in step S11 the set value request signal transmitted from control device 20 transmits the signal (set value response signal) including the set values of the input selector, the sound volume, and the tone control for playback device 10 in response to the request signal.

Control device 20 receives the set value response signal transmitted from playback device 10 (step S12).

Control device 20 receiving in step S12 the set value response signal transmitted from playback device 10 transmits the signal (the notification signal indicating start of the acoustic correction process) notifying playback device 10 of the start of the acoustic correction process to playback device 10 (step S14).

Playback device 10 receiving the notification signal transmitted from the control device in step S14 transmits the signal (the response signal to the start of the acoustic correction process) responding to the notification of the start of the acoustic correction process to control device 20.

Control device 20 receives the response signal transmitted from playback device 10 (step S15).

Control device 20 then transmits the signal (tone control off instruction signal) directing turn-off of the tone control to playback device 10 (step S16).

Playback device 10 receiving in step S16 the instruction signal transmitted from control device 20 turns off the tone control in response to the instruction signal, and then, transmits the signal (tone control off response signal) indicating that the tone control is turned off to control device 20.

Control device 20 receives the tone control off response signal transmitted from playback device 10 (step S17).

Now, the detail of the background noise measuring process (step S2) illustrated in FIG. 6 will be described with reference to the flowchart in FIG. 8.

Figure 8:
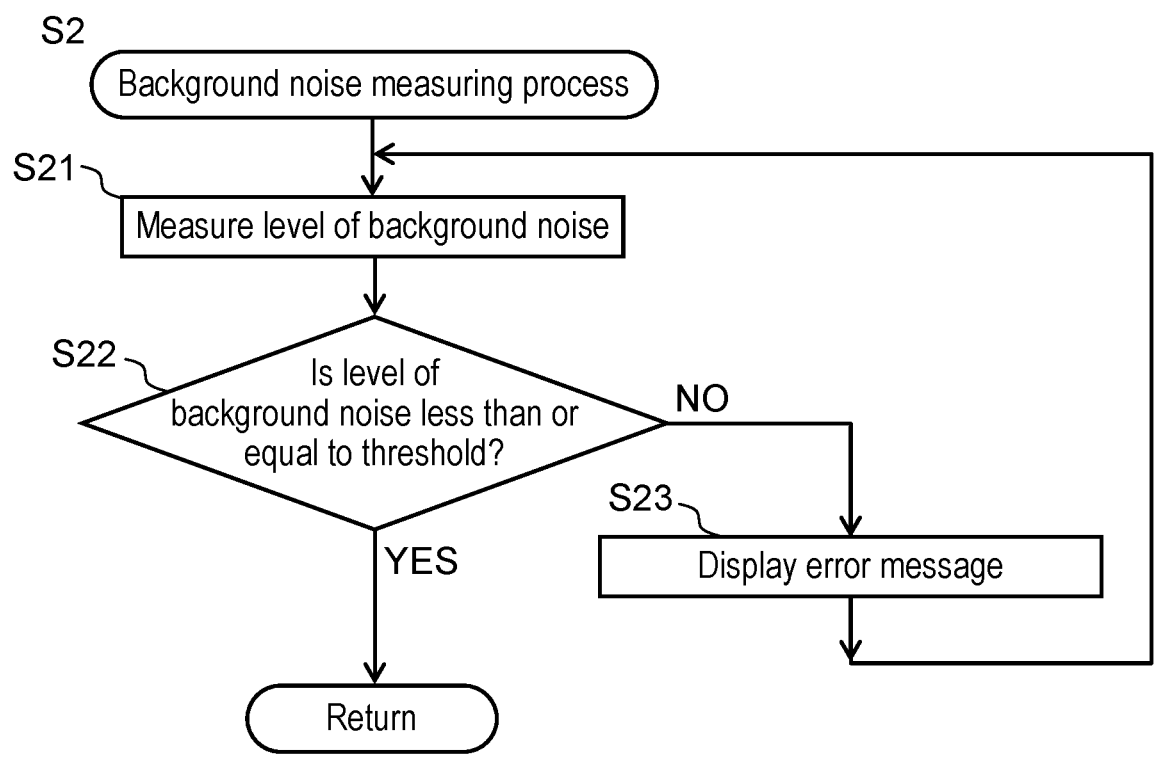
FIG. 8 is a flowchart illustrating an example of a subroutine of a background noise measuring process (step S2) illustrated in FIG. 6.

FIG. 8 is a flowchart illustrating an example of a subroutine of the background noise measuring process (step S2) illustrated in FIG. 6.

In the background noise measuring step (step S2), processor 23 in control device 20 firstly records the background noise in the room using microphone 25 to measure the level of the background noise in the room (step S21), as illustrated in the flowchart in FIG. 8.

In step S21, when playback device 10 stops a playback operation of a sound (that is, playback device 10 does not play back a sound signal such as music, test signals, and the like, and no sound is output through loudspeaker 18 connected to playback device 10), processor 23 in control device 20 records sounds (background noise) around control device 20 using microphone 25. During recording, the sound signal (digital sound signal) acquired as the background noise is stored in storage device 24 in control device 20, for example. The sound playback operation by playback device 10 may be stopped by user 102 operating playback device 10 using control device 20, stopped by user 102 directly operating playback device 10, or stopped by other means.

The level of the background noise is represented by a signal level within a time domain. Processor 23 in control device 20 compares the level of the background noise acquired in step S21 with a predetermined threshold, and determines whether the background noise is less than or equal to the threshold (step S22).

When determining in step S22 that the level of the background noise is less than or equal to the threshold (YES in step S22), processor 23 in control device 20 moves the process to step S3 illustrated in FIG. 6.

When determining in step S22 that the level of the background noise is larger than the threshold (NO in step S22), processor 23 in control device 20 displays an error message in display 29 (step S23). The error message displayed in display 29 in step S23 is a message for notifying user 102 that the background noise is large, and it may be a message of "wait until there is silence in the room", for example.

After executing the process in step S23, processor 23 in control device 20 returns the process back to step S21, and executes again the processes in step S21 and subsequent steps.

Next, the detail of the playback sound volume adjusting process (step S3) illustrated in FIG. 6 will be described with reference to flowcharts in FIGS. 9 and 10.

Figure 9:
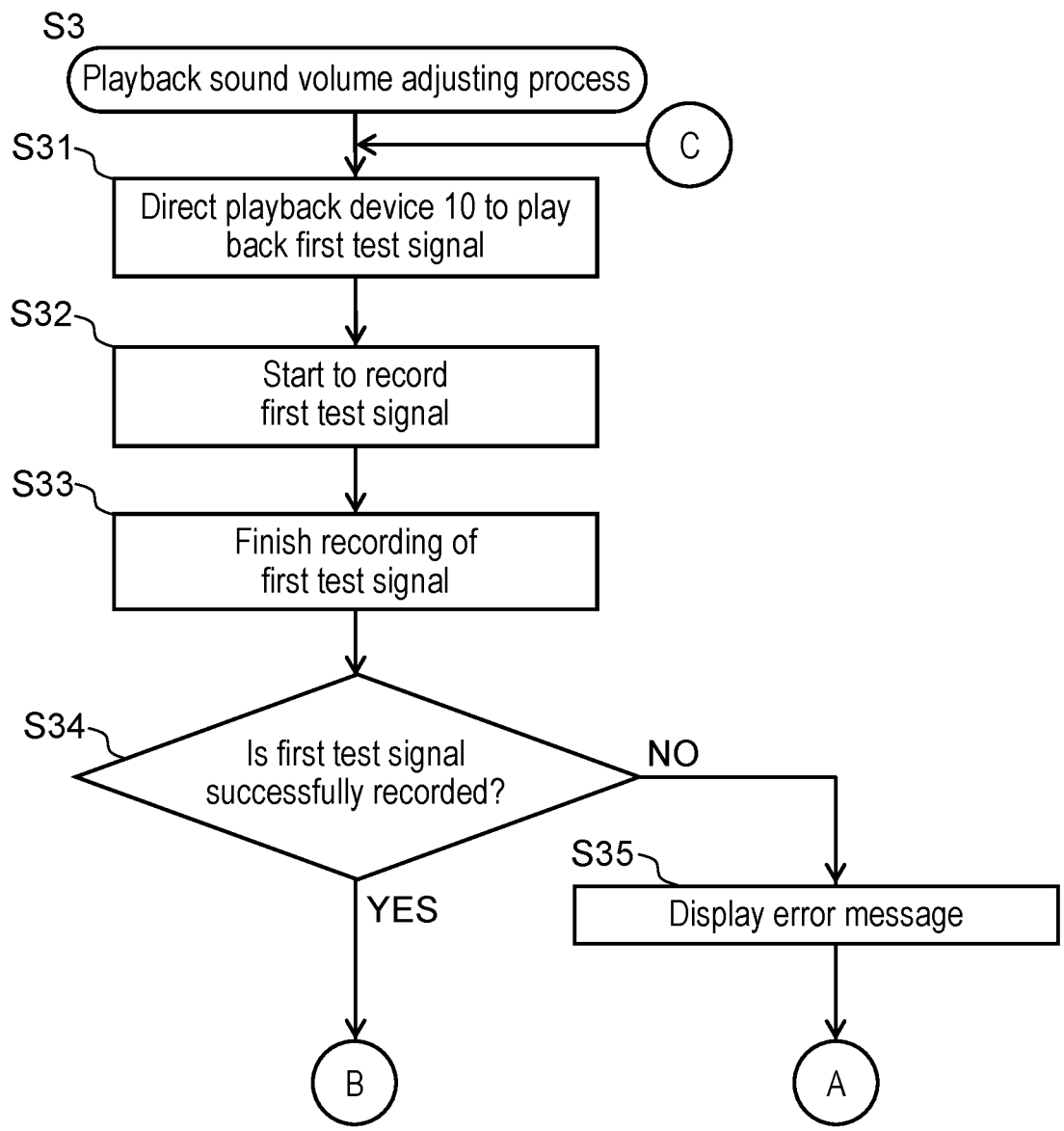
FIG. 9 is a flowchart illustrating an example of a first part of a subroutine of a playback sound volume adjusting process (step S3) illustrated in FIG. 6.

FIG. 9 is a flowchart illustrating an example of a first part of a subroutine of the playback sound volume adjusting process (step S3) illustrated in FIG. 6.

Figure 10:
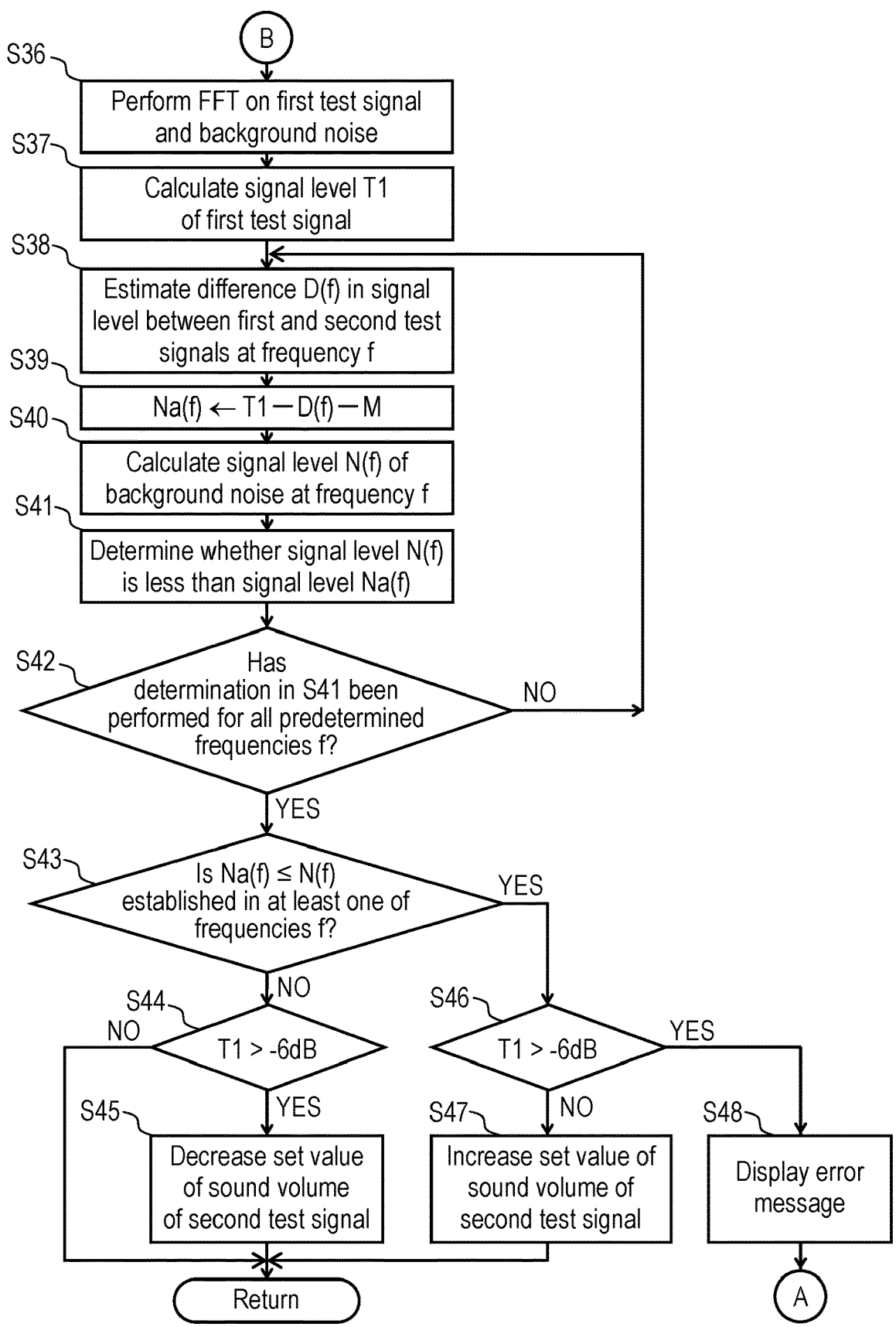
FIG. 10 is a flowchart illustrating an example of a second part of the subroutine of the playback sound volume adjusting process (step S3) illustrated in FIG. 6.

FIG. 10 is a flowchart illustrating an example of a second part of the subroutine of the playback sound volume adjusting process (step S3) illustrated in FIG. 6.

In the playback sound volume adjusting process (step S3), processor 23 in control device 20 firstly transmits the first control signal (the instruction signal directing playback of the first test signal illustrated in FIG. 13) directing playback device 10 to play back the first test signal through loudspeaker 18 to playback device 10 via communication circuit 22 and antenna 21 (step S31), as illustrated in the flowchart in FIG. 9. The first control signal includes an instruction value of the sound volume of the first test signal.

Processor 12 in playback device 10 receives the first control signal transmitted from control device 20 in step S31 via antenna 14 and communication circuit 13. Processor 12 in playback device 10 starts an operation for playing back the first test signal through loudspeaker 18 in response to the received first control signal (indicated as step S81 in FIG. 13). Processor 12 in playback device 10 plays back and outputs, through loudspeaker 18, the first test signal at a sound volume based on the instruction value for the sound volume included in the received first control signal. For example, when the sound volume of playback device 10 can be set within a range from 0 to 100, and the instruction value included in the received first control signal is 35, processor 12 in playback device 10 plays back and outputs, through loudspeaker 18, the first test signal at a volume of 35. Processor 12 in playback device 10 plays back the first test signal for a predetermined time (for example, for five seconds).

Processor 23 in control device 20 starts to record the first test signal acquired through microphone 25 (step S32) after the playback of the first test signal is started by playback device 10 or after the first control signal is transmitted to playback device 10 in step S31. The first test signal (digital sound signal) acquired in step S32 is stored in storage device 24 in control device 20, for example.

Processor 12 in playback device 10 plays back the first test signal for a predetermined time (for example, for five seconds), and then, finishes the playback of the first test signal (indicated as step S82 in FIG. 13).

Processor 23 in control device 20 finishes the recording of the first test signal (step S33) after the playback of the first test signal by playback device 10 is finished. Processor 23 in control device 20 may finish the recording of the first test signal just after the playback of the first test signal by playback device 10 is finished or may finish the recording of the first test signal when a predetermined time has elapsed (for example, after about one second) after the playback of the first test signal by playback device 10 is finished.

Processor 23 in control device 20 extracts a signal within a predetermined time from the recorded first test signal (digital sound signal). Processor 23 in control device 20 extracts a signal within about 1.5 seconds (for example, 65536 data items) after one second from the recording start position of the recorded first test signal, for example.

Processor 23 in control device 20 determines whether the first test signal acquired in step S32 is successfully recorded by checking, for example, whether the first test signal is normally recorded (step S34).

When determining in step S34 that the first test signal is successfully recorded (YES in step S34), processor 23 in control device 20 moves the process to step S36 illustrated in FIG. 10.

When determining in step S34 that the recording of the first test signal fails (NO in step S34), processor 23 in control device 20 displays an error message in display 29 (step S35). The error message displayed in display 29 in step S35 is, for example, a message for notifying user 102 of failure to record the first test signal. Control device 20 may fail to record the first test signal, when playback device 10 cannot at least partially play back the first test signal, when playback device 10 is not a DMP or DMR, or when the power source of playback device 10 is turned off, for example.

After executing the process in step S35, processor 23 in control device 20 returns the process back to step S14 illustrated in FIG. 7, and executes again the processes in step S14 and subsequent steps.

When determining in step S34 that the first test signal is successfully recorded (YES in step S34), processor 23 in control device 20 performs fast Fourier transform (FFT) on the first test signal recorded in step S32 and the background noise recorded in step S21 as illustrated in the flowchart in FIG. 10 (step S36). Thus, processor 23 in control device 20 can recognize the relation between frequency and signal level in the first test signal recorded in step S32 and in the background noise recorded in step S21.

Processor 23 in control device 20 then calculates signal level T1 of the first test signal acquired in step S32 (step S37). Processor 23 in control device 20 can calculate signal level T1 of the acquired first test signal by using the result of the FFT executed in step S36.

Then, processor 23 in control device 20 estimates difference D(f) between signal level T1 of the acquired first test signal and signal level T2(f) of the second test signal at the plurality of predetermined frequencies f (for example, f=100 Hz and 10 kHz) (step S38).

Then, processor 23 in control device 20 calculates allowable signal level Na(f)=T1−D(f)−M of the background noise by subtracting predetermined measurement margin M from signal level T2(f)=T1−D(f) of the second test signal based on D(f) estimated in step S38 at the plurality of predetermined frequencies f (for example, f=100 Hz and 10 kHz) (step S39).

Processor 23 in control device 20 then calculates signal level N(f) of the background noise at the plurality of predetermined frequencies f (for example, f=100 Hz and 10 kHz) (step S40). Processor 23 in control device 20 can calculate signal level N(f) of the background noise acquired in step S21 by using the result of the FFT executed in step S36.

Processor 23 in control device 20 then compares signal level N(f) of the background noise acquired in step S40 and allowable signal level Na(f) of the background noise acquired in step S39, and determines whether signal level N(f) of the background noise is less than allowable signal level Na(f) of the background noise (step S41). The determination result in step S41 is stored in storage device 24 in control device 20, for example.

Then, processor 23 in control device 20 determines whether the determination in step S41 is performed for all of the plurality of predetermined frequencies f (for example, f=100 Hz and 10 kHz) (step S42).

When determining in step S42 that there is a frequency for which the determination in step S41 is not performed from among the plurality of predetermined frequencies f (for example, frequency f=100 Hz and 10 kHz) (NO in step S42), processor 23 in control device 20 returns the process back to step S38, and executes again the processes in step S38 and subsequent steps.

When determining in step S42 that the determination in step S41 is performed for all of the plurality of predetermined frequencies f (for example, f=100 Hz and 10 kHz) (YES in step S42), processor 23 in control device 20 determines whether allowable signal level Na(f) of the background noise is less than or equal to signal level N(f) of the background noise (that is, Na(f)≤N(f)) in at least one of the plurality of predetermined frequencies f (for example, f=100 Hz and 10 kHz) (step S43).

When determining in step S43 that allowable signal level Na(f) of the background noise is larger than signal level N(f) of the background noise (that is, Na(f)>N(f)) at all of the plurality of predetermined frequencies f (NO in step S43), processor 23 in control device 20 determines whether signal level T1 of the acquired first test signal is greater than a predetermined threshold (for example, −6 dB) (step S44).

When determining in step S44 that signal level T1 of the acquired first test signal is less than or equal to the predetermined threshold (for example, −6 dB) (NO in step S44), processor 23 in control device 20 moves the process to step S4 illustrated in FIG. 6 while maintaining the set value of the sound volume of the second test signal at the current set value.

When determining in step S44 that signal level T1 of the acquired first test signal is greater than the predetermined threshold (for example, −6 dB) (YES in step S44), processor 23 in control device 20 reduces the set value of the sound volume of the second test signal from the current set value, and moves the process to step S4 illustrated in FIG. 6.

When determining in step S43 that allowable signal level Na(f) of the background noise is less than or equal to signal level N(f) of the background noise (that is, Na(f)≤N(f)) in at least one of the plurality of predetermined frequencies f (YES in step S43), processor 23 in control device 20 determines whether signal level T1 of the acquired first test signal is greater than a predetermined threshold (for example, −6 dB) (step S46).

When determining in step S46 that signal level T1 of the acquired first test signal is less than or equal to the predetermined threshold (for example, −6 dB) (NO in step S46), processor 23 in control device 20 increases the set value of the sound volume of the second test signal from the current set value, and moves the process to step S4 illustrated in FIG. 6.

When determining in step S46 that signal level T1 of the acquired first test signal is greater than the predetermined threshold (for example, −6 dB) (YES in step S46), processor 23 in control device 20 displays an error message in display 29 (step S48). The error message displayed in display 29 in step S48 is, for example, a message for notifying user 102 of something wrong in the measurement for the sound correction process.

After executing the process in step S48, processor 23 in control device 20 returns the process back to step S14 illustrated in FIG. 7, and executes again the processes in step S14 and subsequent steps.

Next, the processes executed by playback device 10 and control device 20 in steps S31 to S33 will be described with reference to the sequence diagram in FIG. 13.

As illustrated in FIG. 13, control device 20 transmits, to playback device 10, the first control signal (the instruction signal directing playback of the first test signal) directing playback device 10 to play back the first test signal through loudspeaker 18 (step S31).

Playback device 10 receiving the first control signal transmitted from control device 20 in step S31 starts to play back the first test signal in response to the received first control signal (step S81).

Control device 20 starts to record the first test signal (step S32).

Playback device 10 plays back the first test signal for a predetermined time (for example, for five seconds), and during this time, control device 20 continues to record the first test signal.

Playback device 10 finishes playback of the first test signal after a predetermined time (for example, about five seconds) has elapsed (step S82).

Control device 20 finishes recording the first test signal (step S33).

Next, the detail of the frequency characteristics measuring process (step S4) illustrated in FIG. 6 will be described with reference to the flowchart in FIG. 11.

Figure 11:
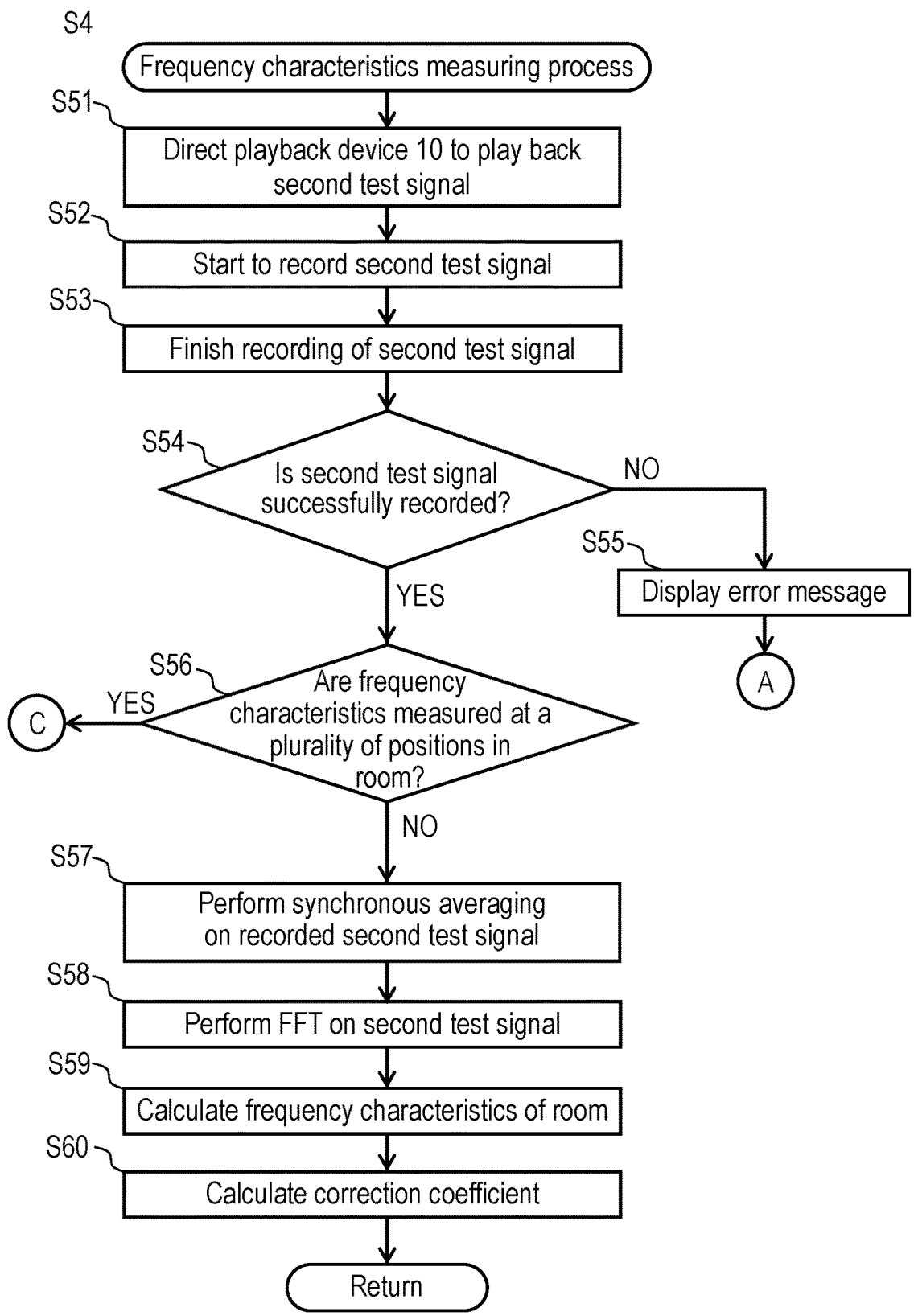
FIG. 11 is a flowchart illustrating an example of a subroutine of a frequency characteristics measuring process (step S4) illustrated in FIG. 6.

FIG. 11 is a flowchart illustrating an example of a subroutine of the frequency characteristics measuring process (step S4) illustrated in FIG. 6.

In the frequency characteristics measuring process (step S4), processor 23 in control device 20 firstly transmits the second control signal (the instruction signal directing playback of the second test signal) directing playback device 10 to play back the second test signal through loudspeaker 18 to playback device 10 via communication circuit 22 and antenna 21 (step S51), as illustrated in the flowchart in FIG. 11. The second control signal transmitted in step S51 includes the set value of the sound volume of the second test signal determined in step S3.

Processor 12 in playback device 10 receives the second control signal transmitted from control device 20 in step S51 via antenna 14 and communication circuit 13. Processor 12 in playback device 10 starts an operation for playing back the second test signal through loudspeaker 18 in response to the received second control signal (indicated as step S83 in FIG. 14). Processor 12 in playback device 10 plays back and outputs, through loudspeaker 18, the second test signal at a sound volume based on the set value of the sound volume included in the received second control signal. Processor 12 in playback device 10 repeatedly plays back the second test signal a predetermined number of times (for example, a number of times corresponding to about ten seconds in total).

Processor 23 in control device 20 starts to record the second test signal acquired through microphone 25 (step S52) after the playback of the second test signal is started by playback device 10 or after the second control signal is transmitted in step S51. The second test signal (digital sound signal) acquired in step S52 is stored in storage device 24 in control device 20, for example.

Figure 14:
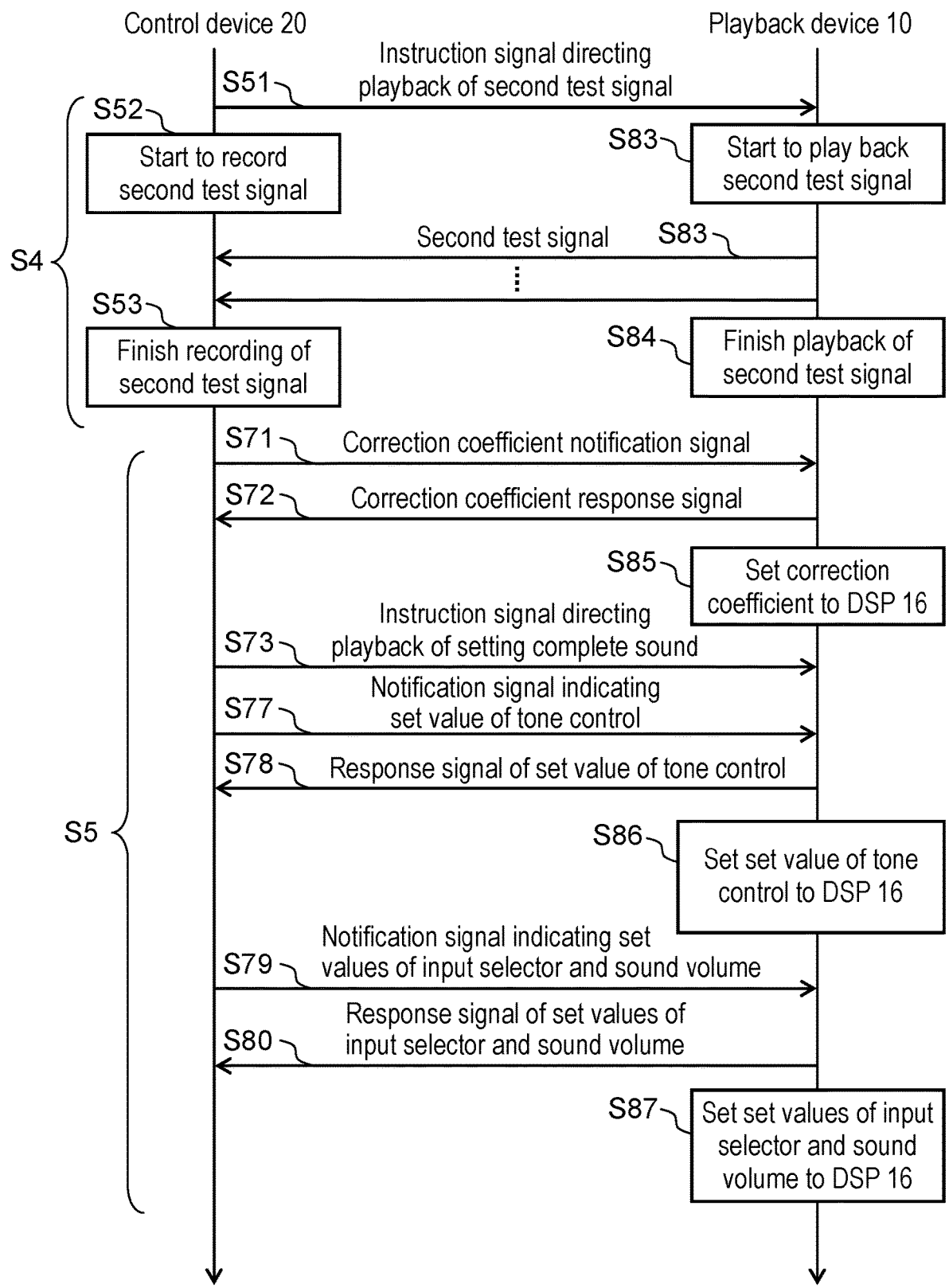
FIG. 14 is a sequence diagram illustrating an example of communication performed between the playback device and the control device in the first exemplary embodiment when processes in steps S4 and S5 illustrated in FIG. 6 are executed.

Processor 12 in playback device 10 repeatedly plays back the second test signal a predetermined number of times (for example, a number of times corresponding to about ten seconds in total), and then, finishes playback of the second test signal (indicated as step S84 in FIG. 14).

Processor 23 in control device 20 finishes recording the second test signal (step S53) after the playback of the second test signal by playback device 10 is finished. Processor 23 in control device 20 may finish the recording of the second test signal just after the playback of the second test signal by playback device 10 is finished or may finish the recording of the second test signal when a predetermined time has elapsed (for example, after one second) after the playback of the second test signal by playback device 10 is finished.

Processor 23 in control device 20 determines whether the second test signal acquired in step S52 is successfully recorded by checking, for example, whether the second test signal is normally recorded (step S54).

When determining in step S54 that the recording of second test signal fails (NO in step S54), processor 23 in control device 20 displays an error message in display 29 (step S55). The error message displayed in display 29 in step S55 is, for example, a message for notifying user 102 of failure to record the second test signal. Control device 20 may fail to record the second test signal, when playback device 10 cannot at least partially play back the second test signal, when playback device 10 is not a DMP or DMR, or when the power source of playback device 10 is turned off, for example.

After executing the process in step S55, processor 23 in control device 20 returns the process back to step S14 illustrated in FIG. 7, and executes again the processes in step S14 and subsequent steps.

When determining in step S54 that the second test signal is successfully recorded (YES in step S54), processor 23 in control device 20 determines whether frequency characteristics are measured at a plurality of positions in the room (step S56). This determination may be made based on the instruction from user 102, or may be made by processor 23 in control device 20 based on the measurement result so far or the like or based on a number of measurement times determined in advance by control device 20.

When determining in step S56 that the frequency characteristics are measured at the plurality of positions in the room (YES in step S56), processor 23 in control device 20 returns the process back to step S31 illustrated in FIG. 9. After user 102 moves to a position different from the current position in the room together with control device 20, processor 23 in control device 20 executes again the processes from step S31 to step S56. The processes from steps S31 to S56 are repeatedly executed at each of the plurality of positions in the room. When doing so, processor 23 in control device 20 may restart the processes in step S31 and subsequent steps on receipt of an input operation performed on control device 20 by user 102 for indicating that user 102 has moved to the next position.

When determining in step S56 that the frequency characteristics are measured at only one position in the room or that the processes from steps S31 to S54 are executed at all of the plurality of positions in the room (NO in step S56), processor 23 in control device 20 performs synchronous averaging on the recorded second test signal (step S57).

Now, the synchronous averaging executed in step S57 will be described with reference to FIG. 15.

Figure 15:
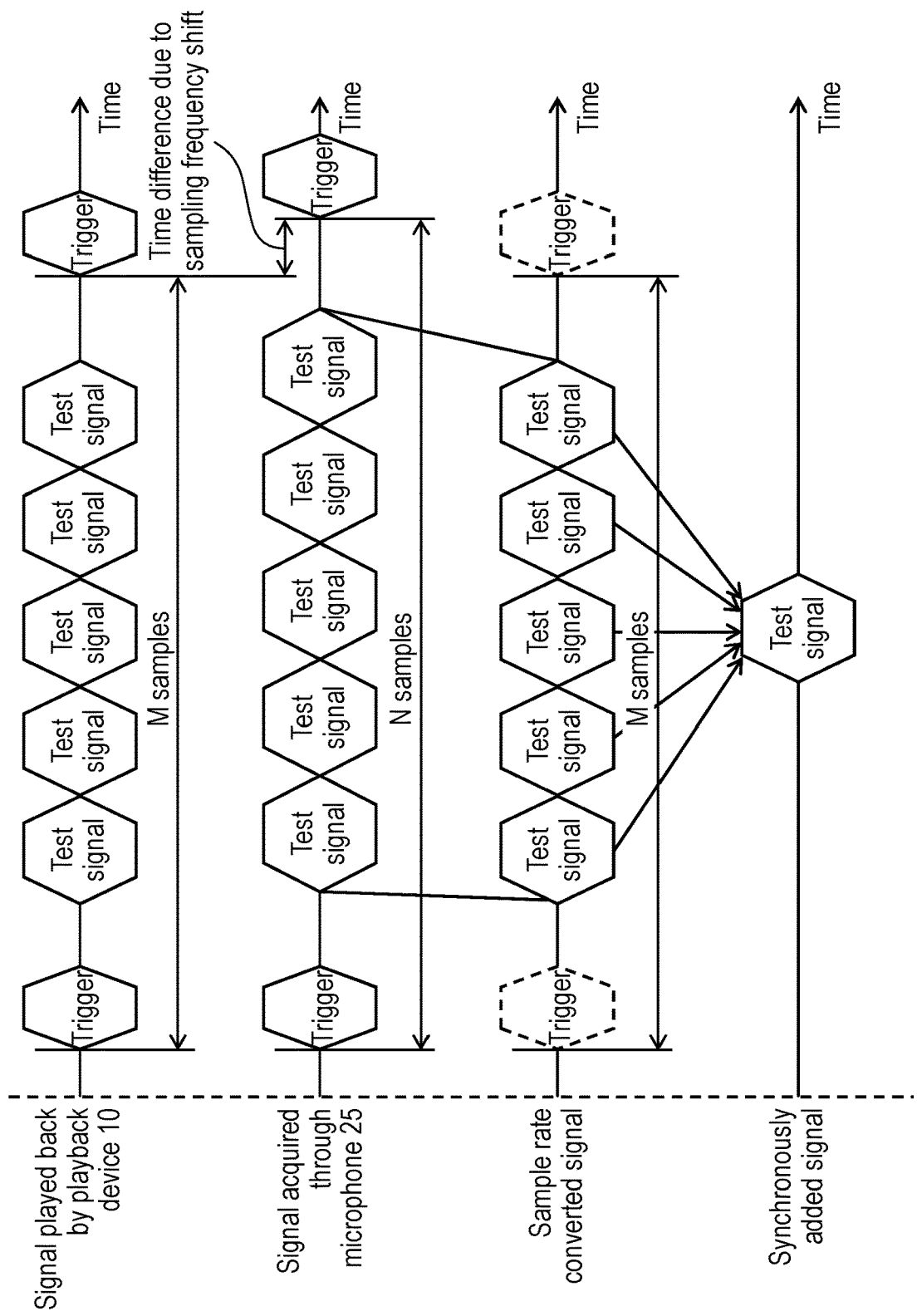
FIG. 15 is a diagram for describing synchronous averaging executed in step S57 illustrated in FIG. 11.

FIG. 15 is a diagram for describing the synchronous averaging executed in step S57 illustrated in FIG. 11. In FIG. 15, a horizontal axis represents a time.

In general, a clock signal (reference clock) used in digital-to-analog converter 17 in playback device 10 and a clock signal (reference clock) used in analog-to-digital converter 26 in control device 20 are different signals independently generated in the respective devices. Therefore, it is highly likely that a frequency of a clock signal used in digital-to-analog converter 17 in playback device 10 (that is, a clock signal synchronized with the digital second test signal before being digital-to-analog converted which is played back by playback device 10) and a frequency of a clock signal used in analog-to-digital converter 26 in control device 20 (that is, a sampling frequency when the analog second test signal acquired through microphone 25 is analog-to-digital converted) are shifted from each other.

When a synchronous averaging process and convolutional calculation are performed for measuring frequency characteristics, it is desirable that a number of data (number of digital signals), per unit time (for example, one second), of the second test signal acquired through microphone 25 and analog-to-digital converted into a digital form by analog-to-digital converter 26 and a number of data (number of digital signals), per unit time (for example, one second), of the digital second test signal before being digital-to-analog converted by digital-to-analog converter 17 in playback device 10 match each other.

When the frequency of the digital second test signal played back by playback device 10 and the frequency (sampling frequency) of the clock signal used in analog-to-digital converter 26 in control device 20 do not match each other, the number of data (number of digital signals), per unit time (for example, one second), of the digital second test signal played back by playback device 10 and the number of data (number of digital signals obtained through sampling), per unit time (for example, one second), of the analog-to-digital converted digital second test signal by control device 20 do not match each other. Therefore, attenuation occurs in the measurement result of high-frequency characteristics, which makes it difficult to measure frequency characteristics with high accuracy. The clock deviation of a typical crystal oscillator is less than or equal to 50 ppm. When there is a shift of 50 ppm between the frequency of the clock signal used in playback device 10 and the frequency of the clock signal used in control device 20, the high-frequency characteristics are reduced to less than or equal to one-tenth.

The first column from the top in FIG. 15 indicates the digital second test signal before being digital-to-analog converted in playback device 10. In the example illustrated in FIG. 15, the second test signal is repeatedly played back five times, for example.

In playback system 30, in order to detect the shift occurring between the frequency of the digital second test signal in playback device 10 and the sampling frequency of analog-to-digital converter 26 in control device 20, a trigger signal is inserted at the head and at the end of the digital second test signal (second test signal in one measurement) in playback device 10. Here, M digital data items (hereinafter referred to as samples) including the trigger signal at the head are present between the trigger signal at the head and the trigger signal at the end. For example, when a simple pulse signal is used as the trigger signal, the trigger signal is buried in disturbance (noise) generated during the measurement of frequency characteristics, and it may be difficult to accurately detect the trigger signal by control device 20. Therefore, in the present exemplary embodiment, a LOG-TSP signal having large energy is also used for the trigger signal. Thus, the possibility that the trigger signal is buried in noise can be reduced, whereby the trigger signal can be detected by control device 20 with high accuracy.

The second column from the top in FIG. 15 indicates the second test signal acquired by control device 20 through microphone 25 and analog-to-digital converted by analog-digital converter 26. Processor 23 in control device 20 calculates a cross-correlation between the acquired second test signal and the known trigger signal, determines the position having the maximum correlation as the trigger signal at the head, and thus detects the trigger signal at the head. The position of the second test signal can be calculated as a relative position from the trigger signal at the head. Processor 23 in control device 20 detects the position of the trigger signal at the end using the similar cross-correlation used for detecting the trigger signal at the head. Here, N digital data items (hereinafter referred to as samples) including the trigger signal at the head are present between the trigger signal at the head and the trigger signal at the end.

A ratio between a number of samples M of the second test signal indicated in the first column from the top in FIG. 15 and a number of samples N of the second test signal indicated in the second column from the top in FIG. 15 indicates a sampling frequency shift. In order to measure the impulse response with high accuracy by control device 20, such a shift needs to be corrected.

The third column from the top in FIG. 15 indicates the second test signal on which sampling rate conversion is performed by control device 20. In control device 20, in order to correct the sampling frequency shift, processor 23 in control device 20 performs asynchronous sample rate conversion by a factor of M/N on the second test signal acquired through microphone 25 and analog-to-digital converted by analog-digital converter 26. Then, processor 23 converts the number of samples of the second test signal indicated in the second column from the top in FIG. 15 into the number same as the number of samples of the second test signal indicated in the first column from the top in FIG. 15, and thus, the second test signal indicated in the third column from the top in FIG. 15 is obtained. Control device 20 performs the abovementioned sampling rate conversion on the second test signal acquired through microphone 25 and analog-to-digital converted by analog-to-digital converter 26, thereby enabling highly accurate measurement with less deterioration in the high-frequency characteristics caused by the sampling frequency shift.

Control device 20 needs a memory capacity about 64 times as large as that of the acquired digital data for the sampling rate conversion in the present exemplary embodiment. However, a smartphone is generally provided with a large-capacity memory, and therefore, the abovementioned sampling rate conversion process can be achieved using the memory provided to the smartphone.

The fourth column from the top in FIG. 15 indicates a signal on which synchronous averaging is performed. Processor 23 in control device 20 performs arithmetic processing of synchronous averaging on a plurality of (for example, five) chronologically consecutive second test signals after the execution of the abovementioned sampling rate conversion, thereby being capable of reducing an influence of uncorrelated random noise during the measurement of frequency characteristics. Then, processor 23 in control device 20 calculates an impulse response by convoluting the second test signal on which synchronous averaging has been performed and a complex conjugate reversed signal.

The process in step S57 and subsequent steps will be described with reference back to the flowchart in FIG. 11.

After executing the process in step S57, processor 23 in control device 20 performs the FFT on the second test signal (digital sound signal) recorded in step S52 (step S58). Thus, processor 23 in control device 20 can recognize the relation between the frequency and the signal level of the second test signal recorded in step S52.

Then, processor 23 in control device 20 calculates frequency characteristics of the room (step S59). Processor 23 in control device 20 calculates the frequency characteristics of the room based on an impulse response of the room with respect to the second test signal.

Then, processor 23 in control device 20 calculates a correction coefficient of frequency characteristics to be set to playback device 10 (step S60). The correction coefficient can be theoretically calculated as a ratio between target frequency characteristics to be obtained by correction and the measured frequency characteristics.

Figure 16:
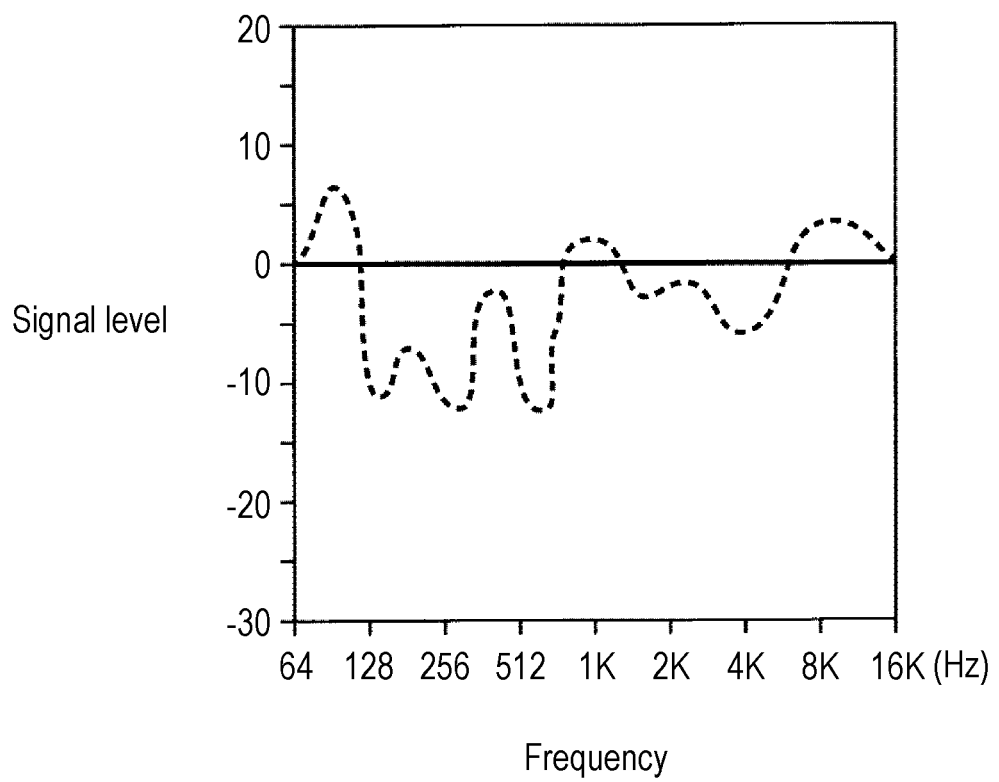
FIG. 16 is a graph schematically illustrating an example of measured frequency characteristics before a correction coefficient calculated by the frequency characteristics measuring step (step S4) illustrated in FIG. 6 is set to the playback device, and an example of target frequency characteristics to be obtained by correction.
Figure 17:
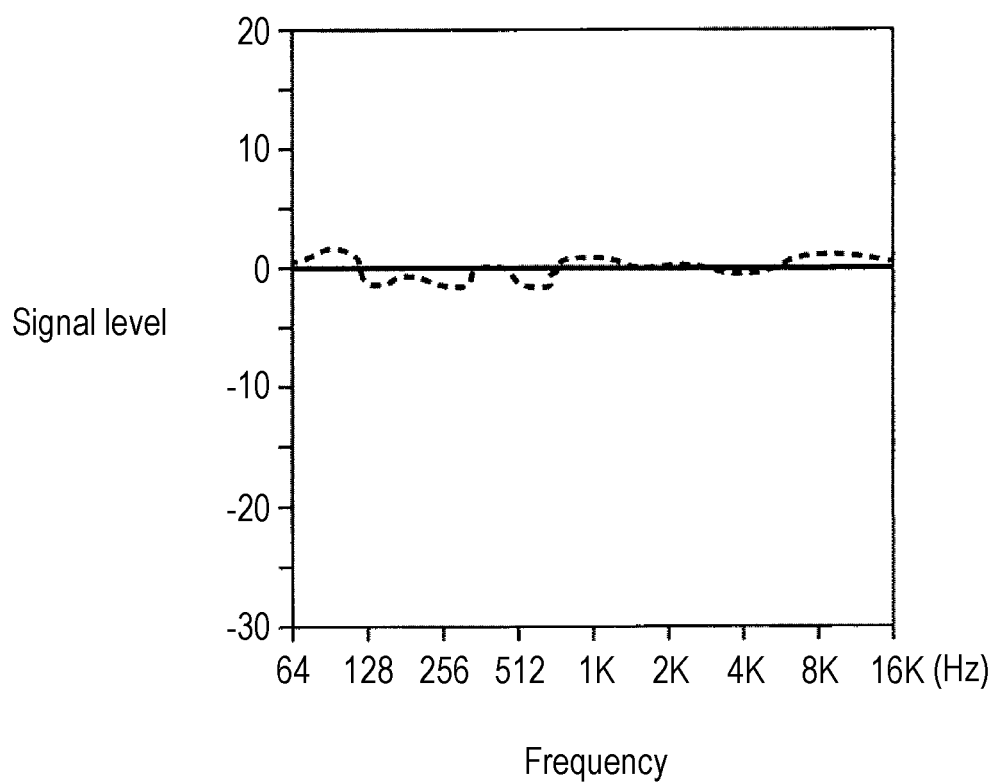
FIG. 17 is a graph schematically illustrating an example of measured frequency characteristics after the correction coefficient calculated by the frequency characteristics measuring step (step S4) illustrated in FIG. 6 is set to the playback device, and an example of target frequency characteristics to be obtained by correction.

FIGS. 16 and 17 illustrate comparison between the target frequency characteristics to be obtained by correction and the measured frequency characteristics in playback system 30.

FIG. 16 is a graph schematically illustrating an example of the measured frequency characteristics before the correction coefficient calculated by the frequency characteristics measuring step (step S4) in FIG. 6 is set to playback device 10, and an example of the target frequency characteristics to be obtained by correction.

FIG. 17 is a graph schematically illustrating an example of the measured frequency characteristics after the correction coefficient calculated by the frequency characteristics measuring step (step S4) in FIG. 6 is set to playback device 10, and the example of the target frequency characteristics to be obtained by correction. In FIGS. 16 and 17, the target frequency characteristics to be obtained by correction are indicated by a solid line, and the measured frequency characteristics are indicated by a broken line. In FIGS. 16 and 17, a vertical axis represents a signal level and a horizontal axis represents a frequency.

In playback system 30, processor 23 in control device 20 executes the frequency characteristics measuring process in step S4, and sets the correction coefficient calculated by the frequency characteristics measuring process to processor 12 in playback device 10. Thus, the frequency characteristics of the sound which is output through loudspeaker 18 connected to playback device 10 and which reaches the ears of user 102 can be made close to the target frequency characteristics to be obtained by correction, as can be seen from comparison between the frequency characteristics (broken line) illustrated in FIG. 16 before the correction coefficient is set and the frequency characteristics (broken line) illustrated in FIG. 17 after the correction coefficient is set.

Next, communication performed in steps S51 to S53 between playback device 10 and control device 20 will be described with reference to the sequence diagram in FIG. 14.

FIG. 14 is a sequence diagram illustrating an example of communication performed between playback device 10 and control device 20 in the first exemplary embodiment when processes in steps S4 and S5 illustrated in FIG. 6 are executed.

As illustrated in FIG. 14, control device 20 transmits, to playback device 10, the second control signal (the instruction signal directing playback of the second test signal) directing playback device 10 to play back the second test signal (step S51).

Playback device 10 receiving the second control signal transmitted from control device 20 in step S51 starts to play back the second test signal in response to the received second control signal (step S83).

Control device 20 starts to record the second test signal (step S52).

Playback device 10 repeatedly plays back the second test signal a predetermined number of times (for example, a number of times corresponding to about ten seconds in total). During this period, control device 20 continues to record the second test signal.

Playback device 10 repeatedly plays back the second test signal the predetermined number of times (for example, the number of times corresponding to about ten seconds in total), and then, finishes playback of the second test signal (step S84).

Control device 20 finishes the recording of the second test signal (step S53).

Next, the detail of the correction coefficient setting process (step S5) illustrated in FIG. 6 will be described with reference to the flowchart in FIG. 12.

Figure 12:
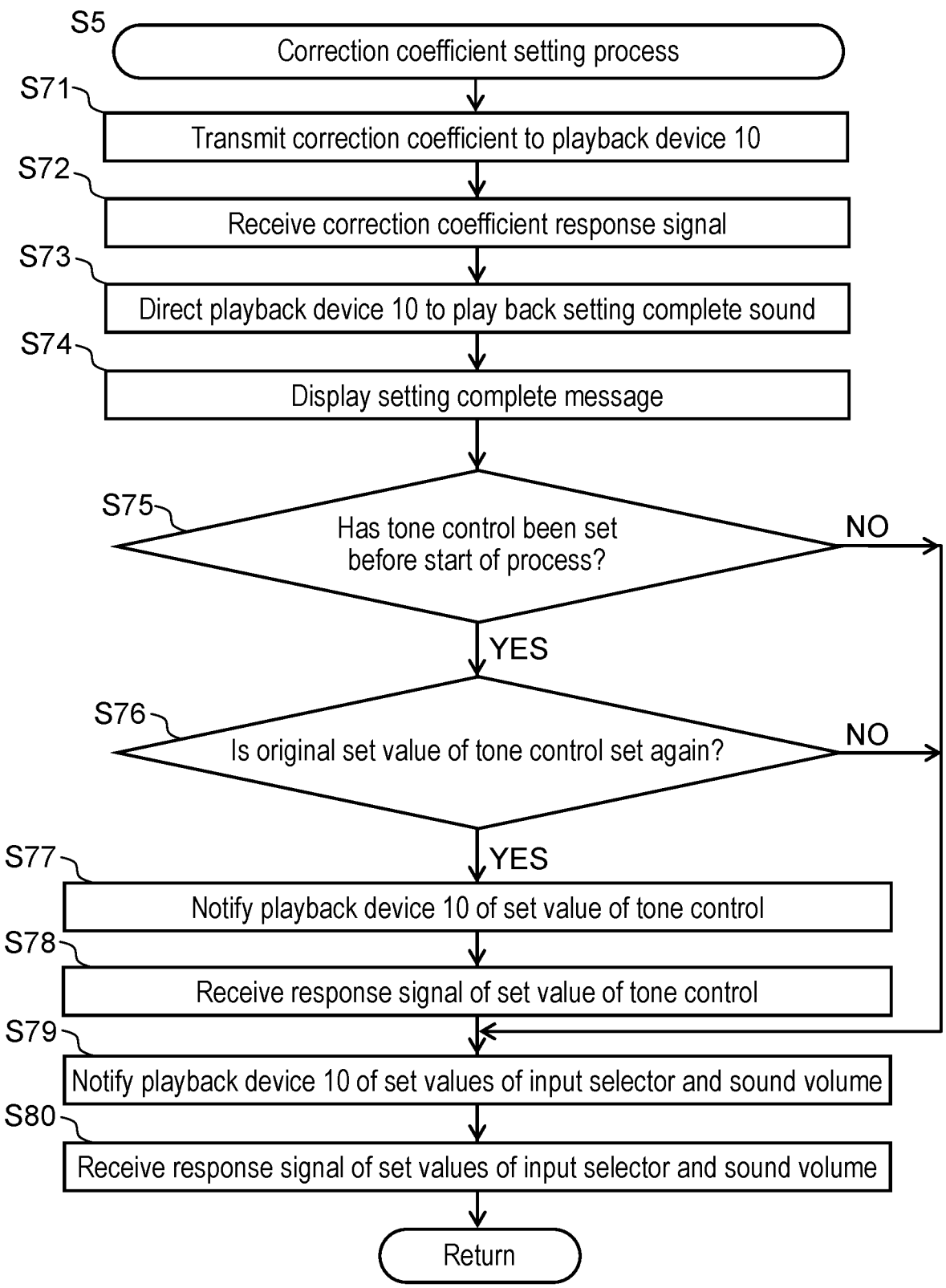
FIG. 12 is a flowchart illustrating an example of a subroutine of a correction coefficient setting process (step S5) illustrated in FIG. 6.

FIG. 12 is a flowchart illustrating an example of a subroutine of the correction coefficient setting process (step S5) illustrated in FIG. 6.

In the correction coefficient setting process (step S5), processor 23 in control device 20 firstly transmits a third control signal (correction coefficient notification signal) notifying playback device 10 of the correction coefficient calculated in step S60 in FIG. 11 to playback device 10 via communication circuit 22 and antenna 21 (step S71), as illustrated in the flowchart in FIG. 12. Processor 23 in control device 20 includes a signal directing playback device 10 to set the correction coefficient included in the third control signal to DSP 16 in playback device 10 and a signal directing playback device 10 to store the correction coefficient into storage device 11 in playback device 10 into the third control signal, when transmitting the third control signal to playback device 10.

Processor 12 in playback device 10 receives the third control signal transmitted from control device 20 in step S71 via antenna 14 and communication circuit 13. Processor 12 in playback device 10 transmits, to control device 20, a signal (correction coefficient response signal) providing a response indicating that the third control signal is received to control device 20 via communication circuit 13 and antenna 14.

Processor 23 in control device 20 receives, via antenna 21 and communication circuit 22, the correction coefficient response signal transmitted from playback device 10 (step S72).

Processor 12 in playback device 10 sets the correction coefficient included in the received third control signal to DSP 16 in playback device 10, and stores the correction coefficient into storage device 11 of playback device 10, in response to the third control signal transmitted from control device 20 in step S71 (indicated as step S85 in FIG. 14).

Processor 23 in control device 20 may repeat the operation for transmitting the third control signal to playback device 10 a predetermined number of times (for example, three times) until receiving a response signal to the third control signal from playback device 10. When unable to receive the response signal to the third control signal from playback device 10 despite the predetermined number of times of executions (for example, three executions) of the operation for transmitting the third control signal to playback device 10, control device 20 may display, in display 29, an error message indicating that control device 20 cannot receive the response signal. Also, control device 20 may subsequently end the process.

Then, processor 23 in control device 20 receiving in step S72 the response signal transmitted from playback device 10 transmits a signal (an instruction signal directing playback of a setting complete sound (a sound indicating that the correction coefficient setting is completed)) directing playback device 10 to play back the setting complete sound to playback device 10 via communication circuit 22 and antenna 21 (step S73).

Processor 12 in playback device 10 receives the instruction signal, which directs playback of the setting complete sound and which is transmitted from control device 20 in step S73, via antenna 14 and communication circuit 13. Processor 12 in playback device 10 plays back the setting complete sound in response to the received instruction signal. When doing so, processor 12 in playback device 10 may play back the setting complete sound at a sound volume same as that when the second test signal is played back, for example. Further, the setting complete sound may be any sound such as a beep, melody, or a sound message, as long as it can tell user 102 that the setting of the correction coefficient is completed.

Then, processor 23 in control device 20 displays a setting complete message (a message indicating that the setting of the correction coefficient is completed) in display 29 (step S74).

Processor 23 in control device 20 then determines whether tone control has been set to playback device 10 before the start of the acoustic correction process (step S75).

When determining in step S75 that the tone control has been set to playback device 10 (YES in step S75), processor 23 in control device 20 determines whether the original set value of the tone control is set again to playback device 10 (step S76). The determination in step S76 may be made based on an instruction from user 102, based on the result of the determination in step S75 (for example, if the determination in step S75 is YES, YES determination is also made in step S76), or based on other criteria.

When determining in step S76 that the original set value of the tone control is set again to playback device 10 (YES in step S76), processor 23 in control device 20 reads the set value of the tone control stored in storage device 24 of control device 20 in step S13 illustrated in FIG. 7 from storage device 24. Processor 23 in control device 20 then transmits a signal (a notification signal indicating the set value of the tone control) notifying playback device 10 of the read set value of the tone control to playback device 10 via communication circuit 22 and antenna 21 (step S77).

Processor 12 in playback device 10 receives, via antenna 14 and communication circuit 13, the notification signal indicating the set value of the tone control transmitted from control device 20 in step S77. After receiving the notification signal, processor 12 in playback device 10 transmits a signal (a response signal of the set value of the tone control) responding to the received notification signal to control device 20 via communication circuit 13 and antenna 14.

Processor 23 in control device 20 receives, via antenna 21 and communication circuit 22, the response signal of the set value of the tone control transmitted from playback device 10 (step S78).

Processor 12 in playback device 10 sets, in response to the notification signal indicating the set value of the tone control transmitted from control device 20 in step S77, the set value of the tone control included in the notification signal to DSP 16 (indicated as step S86 in FIG. 14).

Processor 23 in control device 20 then reads the set values of the input selector and the sound volume stored in storage device 24 of control device 20 in step S13 illustrated in FIG. 7 from storage device 24. Then, processor 23 in control device 20 transmits a signal (a notification signal indicating the set values of the input selector and the sound volume) notifying playback device 10 of the read set values of the input selector and the sound volume to playback device 10 via communication circuit 22 and antenna 21 (step S79).

Processor 12 in playback device 10 receives, via antenna 14 and communication circuit 13, the notification signal indicating the set values of the input selector and the sound volume transmitted from control device 20 in step S79. After receiving the notification signal, processor 12 in playback device 10 transmits a signal (a response signal of the set values of the input selector and the sound volume) responding to the received notification signal to control device 20 via communication circuit 13 and antenna 14.

Processor 23 in control device 20 receives, via antenna 21 and communication circuit 22, the response signal of the set values of the input selector and the sound volume transmitted from playback device 10 (step S80).

Processor 12 in playback device 10 sets, in response to the notification signal indicating the set values of the input selector and the sound volume transmitted from control device 20 in step S79, the set values of the input selector and the sound volume included in the notification signal to DSP 16 (indicated as step S87 in FIG. 14).

Next, the processes executed by playback device 10 and control device 20 in steps S71 to S80 will be described with reference to the sequence diagram in FIG. 14.

As illustrated in FIG. 14, control device 20 transmits, to playback device 10, the third control signal (correction coefficient notification signal) notifying playback device 10 of the correction coefficient calculated in step S60 (step S71).

Playback device 10 receiving the third control signal transmitted from control device 20 in step S71 transmits the signal (correction coefficient response signal) responding to the received third control signal to control device 20.

Control device 20 receives the correction coefficient response signal transmitted from playback device 10 (step S72).

Playback device 10 receiving in step S71 the third control signal transmitted from control device 20 sets the correction coefficient included in the third control signal to DSP 16 in playback device 10 and stores the correction coefficient into storage device 11 of playback device 10, in response to the received third control signal (step S85).

Control device 20 receiving in step S72 the correction coefficient response signal transmitted from playback device 10 transmits the signal (the instruction signal directing playback of a setting complete sound) directing playback device 10 to play back the setting complete sound to playback device 10 (step S73).

Playback device 10 receiving the instruction signal directing playback of the setting complete sound transmitted from control device 20 in step S73 starts to play back the setting complete sound.

Control device 20 then transmits the signal (the notification signal indicating the set value of the tone control) notifying playback device 10 of the set value of the tone control read from storage device 24 to playback device 10 (step S77).

Playback device 10 receiving in step S77 the notification signal indicating the set value of the tone control transmitted from control device 20 transmits the signal (the response signal of the set value of the tone control) responding to the received notification signal to control device 20.

Control device 20 receives the response signal of the set value of the tone control transmitted from playback device 10 (step S78).

Playback device 10 receiving in step S77 the notification signal indicating the set value of the tone control transmitted from control device 20 sets, in response to the received notification signal, the set value of the tone control included in the notification signal to DSP 16 in playback device 10 (step S86).

Then, control device 20 transmits the signal (the notification signal indicating the set values of the input selector and the sound volume) notifying playback device 10 of the set values of the input selector and the sound volume which are read from storage device 24 to playback device 10 (step S79).

Playback device 10 receiving in step S79 the notification signal indicating the set values of the input selector and the sound volume transmitted from control device 20 transmits the signal (the response signal of the set values of the input selector and the sound volume) responding to the received notification signal to control device 20.

Control device 20 receives the response signal of the set values of the input selector and the sound volume transmitted from playback device 10 (step S80).

Playback device 10 receiving in step S79 the notification signal indicating the set values of the input selector and the sound volume transmitted from control device 20 sets, in response to the received notification signal, the set values of the input selector and the sound volume included in the notification signal to DSP 16 in playback device 10 (step S87).

[1-6. Effects and Others]

As described above, the control device in the present exemplary embodiment is a control device that controls frequency characteristics of a playback device that is connected to or integrated with a loudspeaker installed in a room. The control device is provided with a first communication circuit that communicates with the playback device, a microphone that acquires a sound signal generated through the loudspeaker, and a first control circuit. The first control circuit: acquires background noise in the room through the microphone and calculates a signal level of the background noise at a plurality of predetermined frequencies; transmits, to the playback device via the first communication circuit, a first control signal directing playback of a first test signal having a predetermined sound volume through the loudspeaker; acquires the first test signal through the microphone and calculates a signal level of the acquired first test signal; estimates a signal level of a second test signal having a predetermined sound volume and predetermined frequency characteristics at the plurality of predetermined frequencies using the signal level of the first test signal as a reference; increases a set value of the sound volume of the second test signal when a signal level obtained by subtracting a predetermined value from the estimated signal level of the second test signal is less than or equal to the signal level of the background noise in at least one of the plurality of predetermined frequencies; transmits, to the playback device via the first communication circuit, a second control signal directing playback of the second test signal having a sound volume corresponding to the set value through the loudspeaker; acquires the second test signal through the microphone, calculates a frequency response of the room based on the acquired second test signal, and calculates a correction coefficient of frequency characteristics to be set to the playback device based on the calculated frequency response of the room; and transmits, to the playback device via the first communication circuit, a third control signal including the correction coefficient of the frequency characteristics to be set to the playback device.

Control device 20 is an example of the control device. Playback device 10 is an example of the playback device. Loudspeaker 18 is an example of the loudspeaker connected to or integrated with the playback device. Communication circuit 22 is an example of the first communication circuit. Microphone 25 is an example of the microphone. Processor 23 is an example of the first control circuit. 100 Hz and 10 kHz are an example of the plurality of predetermined frequencies. The instruction signal directing playback of the first test signal illustrated in FIG. 13 is an example of the first control signal. Signal level T1 is an example of the signal level of the first test signal. Signal level T2($f$) is an example of the signal level of the second test signal at a plurality of predetermined frequencies f. Measurement margin M is an example of the predetermined value subtracted from the signal level of the second test signal. Allowable signal level Na(f) of background noise is an example of the signal level obtained by subtracting the predetermined value from the signal level of the second test signal, and calculation formula Na(f)=T1−D(f)−M is an example of the calculation formula for calculating allowable signal level Na(f) of the background noise. The instruction signal directing playback of the second test signal illustrated in FIG. 14 is an example of the second control signal. Calculation formula T2($f$)=T1−D(f) is an example of the calculation formula used for estimating the signal level of the second test signal at a plurality of predetermined frequencies f. The correction coefficient notification signal illustrated in FIG. 14 is an example of the third control signal.

For example, in the example described in the first exemplary embodiment, control device 20 controls playback device 10 which is connected to or integrated with loudspeaker 18 installed in the room to control frequency characteristics of a sound played back through loudspeaker 18. Control device 20 is provided with first communication circuit 22 that communicates with playback device 10, microphone 25 that acquires a sound signal generated through loudspeaker 18, and processor 23. Processor 23 acquires background noise in the room through microphone 25, and calculates a signal level of the background noise at a plurality of predetermined frequencies f (for example, 100 Hz and 10 kHz). Processor 23 also transmits the first control signal (the instruction signal directing playback of the first test signal) directing playback of the first test signal having a predetermined sound volume through loudspeaker 18 to playback device 10 via communication circuit 22. Further, processor 23 acquires, through microphone 25, the first test signal played back through loudspeaker 18 and calculates signal level T1 of the acquired first test signal. Processor 23 also estimates signal level T2($f$) of the second test signal having a predetermined sound volume and predetermined frequency characteristics at a plurality of predetermined frequencies f (for example, f=100 Hz and 10 kHz) based on signal level T1 of the first test signal. Processor 23 also calculates, for each of the plurality of predetermined frequencies f (for example, 100 Hz and 10 kHz), allowable signal level Na(f) of the background noise by subtracting predetermined measurement margin M from estimated signal level T2($f$) of the second test signal, and when allowable signal level Na(f) of the background noise is less than or equal to the signal level of the background noise in at least one of the plurality of predetermined frequencies f, processor 23 increases the set value of the sound volume of the second test signal. Processor 23 also transmits the second control signal (the instruction signal directing playback of the second test signal) directing playback of the second test signal having a sound volume according to the set value through loudspeaker 18 to playback device 10 via communication circuit 22. Further, processor 23 acquires, through microphone 25, the second test signal played back through loudspeaker 18. Processor 23 also calculates a frequency response of the room based on the acquired second test signal, and calculates a correction coefficient of frequency characteristics to be set to playback device 10 based on the frequency response of the room obtained through calculation.

Processor 23 also transmits the third control signal (correction coefficient notification signal) including the correction coefficient of the frequency characteristics to be set to playback device 10 to playback device 10 via communication circuit 22.

In the control device, the first control circuit may decrease the set value of the sound volume of the second test signal when the signal level of the acquired first test signal exceeds a predetermined threshold.

For example, in control device 20 described in the first exemplary embodiment, processor 23 decreases the set value of the sound volume of the second test signal from the current set value, when signal level T1 of the acquired first test signal exceeds a predetermined threshold (for example, −6 dB).

In the control device, the first test signal may be a sine wave.

For example, in control device 20 described in the first exemplary embodiment, the first test signal is a sine wave having a frequency set to 1 kHz.

In the control device, the second test signal may be a LOG-TSP signal.

For example, in control device 20 described in the first exemplary embodiment, the second test signal is a LOG-TSP signal.

The control device may be a smartphone or a tablet computer.

For example, control device 20 described in the first exemplary embodiment is a smartphone provided with microphone 25.

The playback system according to the present exemplary embodiment is a playback system including a playback device which is connected to or integrated with a loudspeaker installed in a room, and the abovementioned control device. The playback device is provided with a second communication circuit that communicates with the control device, a signal processing circuit having variable frequency characteristics, and a second control circuit. The second control circuit plays back the first test signal through the loudspeaker in response to the first control signal received from the control device via the second communication circuit, plays back the second test signal through the loudspeaker in response to the second control signal received from the control device via the second communication circuit, and corrects the frequency characteristics of the signal processing circuit in response to the third control signal received from the control device via the second communication circuit.

Playback system 30 is an example of the playback system. Communication circuit 13 is an example of the second communication circuit. DSP 16 is an example of the signal processing circuit. Processor 12 is an example of the second control circuit.

For example, in the example in the first exemplary embodiment, playback system 30 includes playback device 10 connected to or integrated with loudspeaker 18 installed in a room, and control device 20. Playback device 10 is provided with communication circuit 13 that communicates with control device 20, DSP 16 having variable frequency characteristics, and processor 12. Processor 12 plays back the first test signal through loudspeaker 18 in response to the first control signal (the instruction signal directing playback of the first test signal) received from control device 20 via communication circuit 13, plays back the second test signal through loudspeaker 18 in response to the second control signal (the instruction signal directing playback of the second test signal) received from control device 20 via communication circuit 13, and corrects the frequency characteristics of DSP 16 in response to the third control signal (correction coefficient notification signal) received from control device 20 via communication circuit 13.

The control method according to the present exemplary embodiment is a control method for controlling frequency characteristics of a playback device that is connected to or integrated with a loudspeaker installed in a room using an external control device of the playback device. The control device is provided with a first communication circuit that communicates with the playback device, a microphone that acquires a sound signal generated through the loudspeaker, and a first control circuit. The control method includes: a step of acquiring background noise in the room through the microphone and calculating a signal level of the background noise at a plurality of predetermined frequencies (for example, steps S2 and S40); a step of transmitting, to the playback device via the first communication circuit, a first control signal directing playback of a first test signal having a predetermined sound volume through the loudspeaker (for example, step S31); a step of acquiring the first test signal through the microphone and calculating a signal level of the acquired first test signal (for example, steps S32 and S37); a step of estimating a signal level of the second test signal having a predetermined sound volume and predetermined frequency characteristics at a plurality of predetermined frequencies using the signal level of the first test signal as a reference (for example, step S38); a step of increasing a set value of the sound volume of the second test signal when a signal level obtained by subtracting a predetermined value from the estimated signal level of the second test signal is less than or equal to the signal level of the background noise in at least one of the plurality of predetermined frequencies (for example, steps S43 and S47); a step of transmitting, to the playback device via the first communication circuit, a second control signal directing playback of the second test signal having a sound volume corresponding to the set value through the loudspeaker (for example, step S51); a step of acquiring the second test signal through the microphone, calculating a frequency response of the room based on the acquired second test signal, and calculating a correction coefficient of frequency characteristics to be set to the playback device based on the calculated frequency response of the room (for example, steps S52, S59, and S60); and a step of transmitting, to the playback device via the first communication circuit, a third control signal including the correction coefficient of the frequency characteristics to be set to the playback device (for example, step S71).

The program according to the present exemplary embodiment is a program for a control device that controls frequency characteristics of a playback device that is connected to or integrated with a loudspeaker installed in a room. The control device is provided with a first communication circuit that communicates with the playback device, a microphone that acquires a sound signal generated through the loudspeaker, and a first control circuit that executes the program. The program is stored in a storage device readable by the first control circuit and causes the first control circuit to execute the steps in the abovementioned control method.

According to the playback system, the control device, the control method, and the program which are configured as described above, the frequency characteristics of the room can be measured using any general-purpose device provided with a microphone, such as a smartphone, without using a measuring device such as a microphone specialized for measurement, whereby the frequency characteristics of the room can be measured with less effort than ever before. Accordingly, convenience for a user using the playback system can be improved.

For example, in playback system 30 in the exemplary embodiment, a smartphone or a tablet computer can be used as control device 20. Thus, playback system 30 can measure the frequency characteristics of the room without using a device specialized for measurement which has been conventionally used for measuring frequency characteristics.

Further, the program that executes the measuring method described in the present exemplary embodiment can be provided to user 102 who uses playback system 30 as application software which runs on the smartphone or the tablet computer used as control device 20. Therefore, user 102 who uses playback system 30 can measure the frequency characteristics of the room in a relatively simple way by operating the smartphone or the tablet computer that executes the application software. Accordingly, convenience for user 102 who uses playback system 30 for measuring the frequency characteristics can be improved.

The application software used on the smartphone or the tablet computer for measuring the frequency characteristics can be configured to display, in display 29, a screen designed to give guidance for an input operation required for user 102 during the measurement of frequency characteristics, when the application software is running. Playback system 30 provided with the application software thus configured enables user 102 who uses playback system 30 and who lacks specialized knowledge about the measurement of frequency characteristics to measure the frequency characteristics of the room in a relatively simple way and adjust frequency characteristics of a sound played back through loudspeaker 18 connected to playback device 10 only by performing an input operation in accordance with the guidance provided by the application software.

With playback system 30 in the present exemplary embodiment, the user can adjust a playback sound volume of the second test signal using the first test signal, thereby being capable of measuring frequency characteristics of the room, while reducing an influence of background noise in the room.

In playback system 30, control device 20 sets, to DSP 16 in playback device 10, the correction coefficient of the frequency characteristics calculated based on the frequency characteristics of the room measured in this way, whereby the frequency characteristics of the sound played back through loudspeaker 18 connected to playback device 10 can be controlled. Thus, in playback system 30, playback device 10 can output, through loudspeaker 18 connected to playback device 10, the playback sound which has been appropriately corrected according to the position of loudspeaker 18 and the position of user 102 in the room where playback system 30 is installed.

Further, playback system 30 in the exemplary embodiment uses a LOG-TSP signal as the second test signal. Thus, playback system 30 can measure the frequency characteristics of the room while ensuring a satisfactory signal-to-noise ratio throughout the entire frequency band which can be played back by playback device 10.

When signal level T1 of the first test signal exceeds a predetermined threshold (for example, −6 dB), signal level T1 may be saturated (clipped). In such a case, when the sound volume of the second test signal still keeps the current set value, the frequency characteristics of the room may not be accurately measured. However, in such a case, processor 23 in control device 20 in playback system 30 described in the exemplary embodiment decreases the set value of the sound volume of the second test signal from the current set value, whereby the frequency characteristics of the room can be measured with high accuracy.

Now, examples of the measurement result of the frequency characteristics of the room by playback system 30 in the exemplary embodiment will be described as measured example 1 and measured example 2.

Measured Example 1

Figure 18:
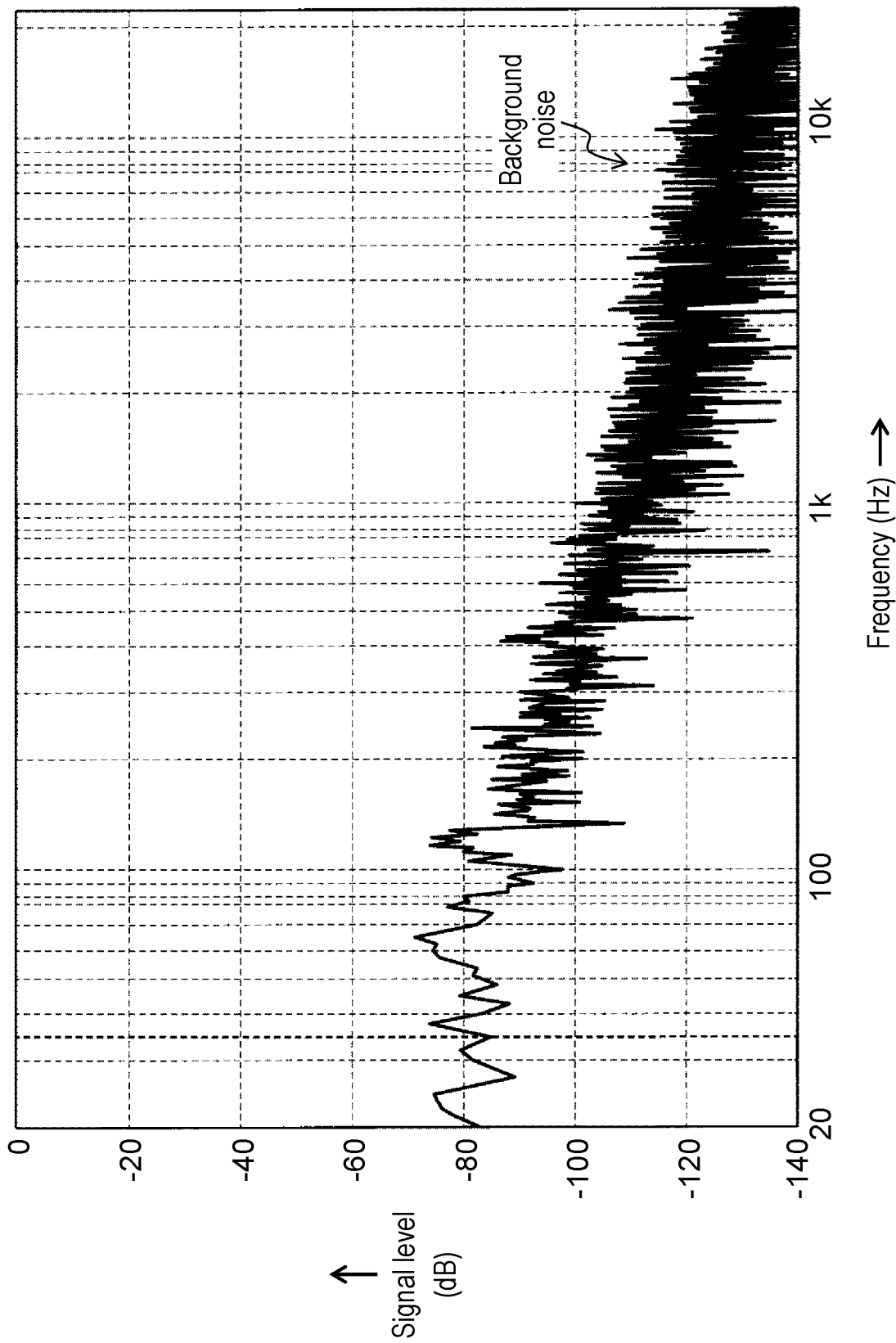
FIG. 18 is a graph illustrating an example of a signal level of background noise measured by the control device in the first exemplary embodiment.

FIG. 18 is a graph illustrating an example of a signal level of background noise measured by control device 20 in the first exemplary embodiment.

Figure 19:
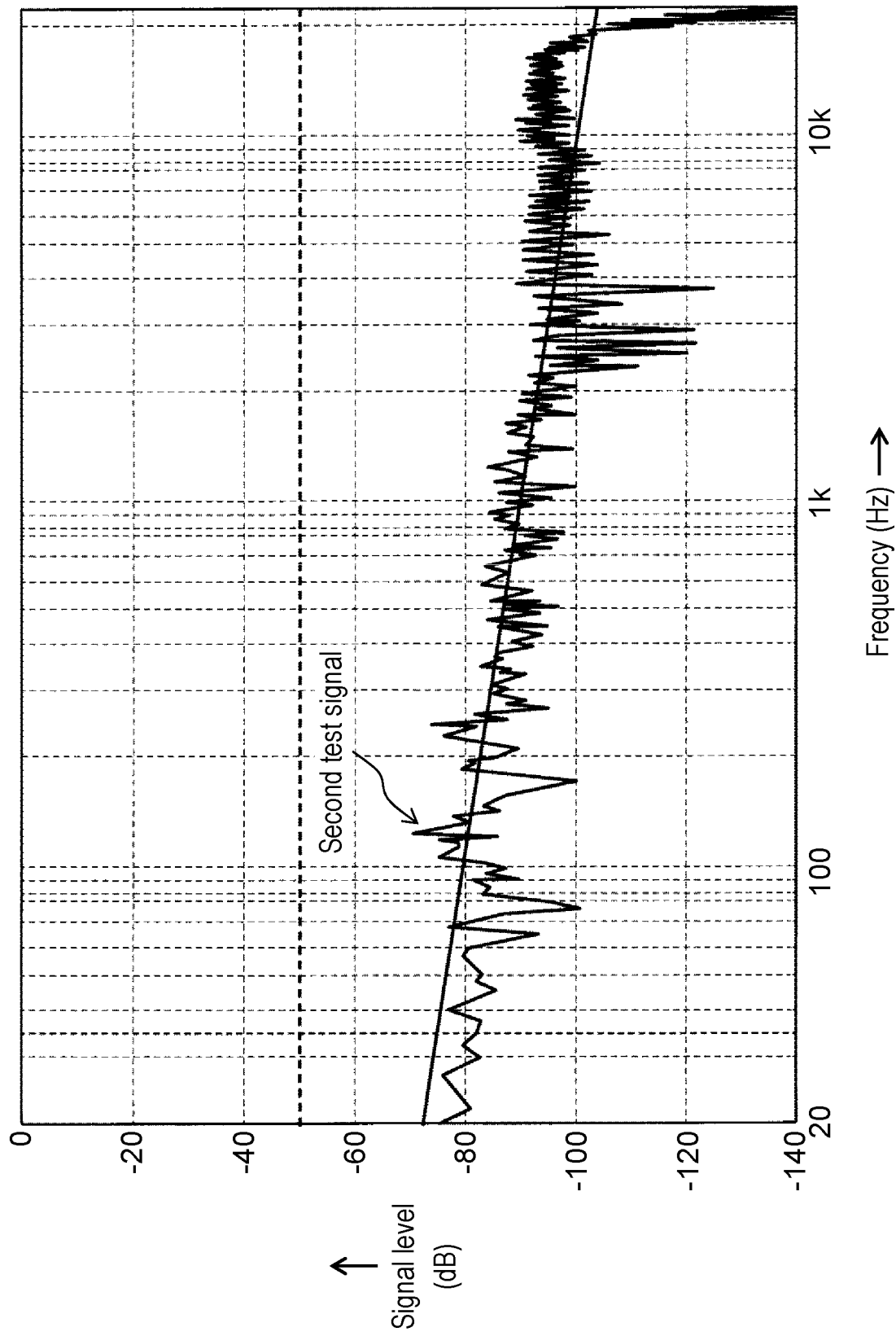
FIG. 19 is a graph illustrating an example of a signal level of the second test signal measured by the control device in the first exemplary embodiment.

FIG. 19 is a graph illustrating an example of a signal level of the second test signal measured by control device 20 in the first exemplary embodiment.

Figure 20:
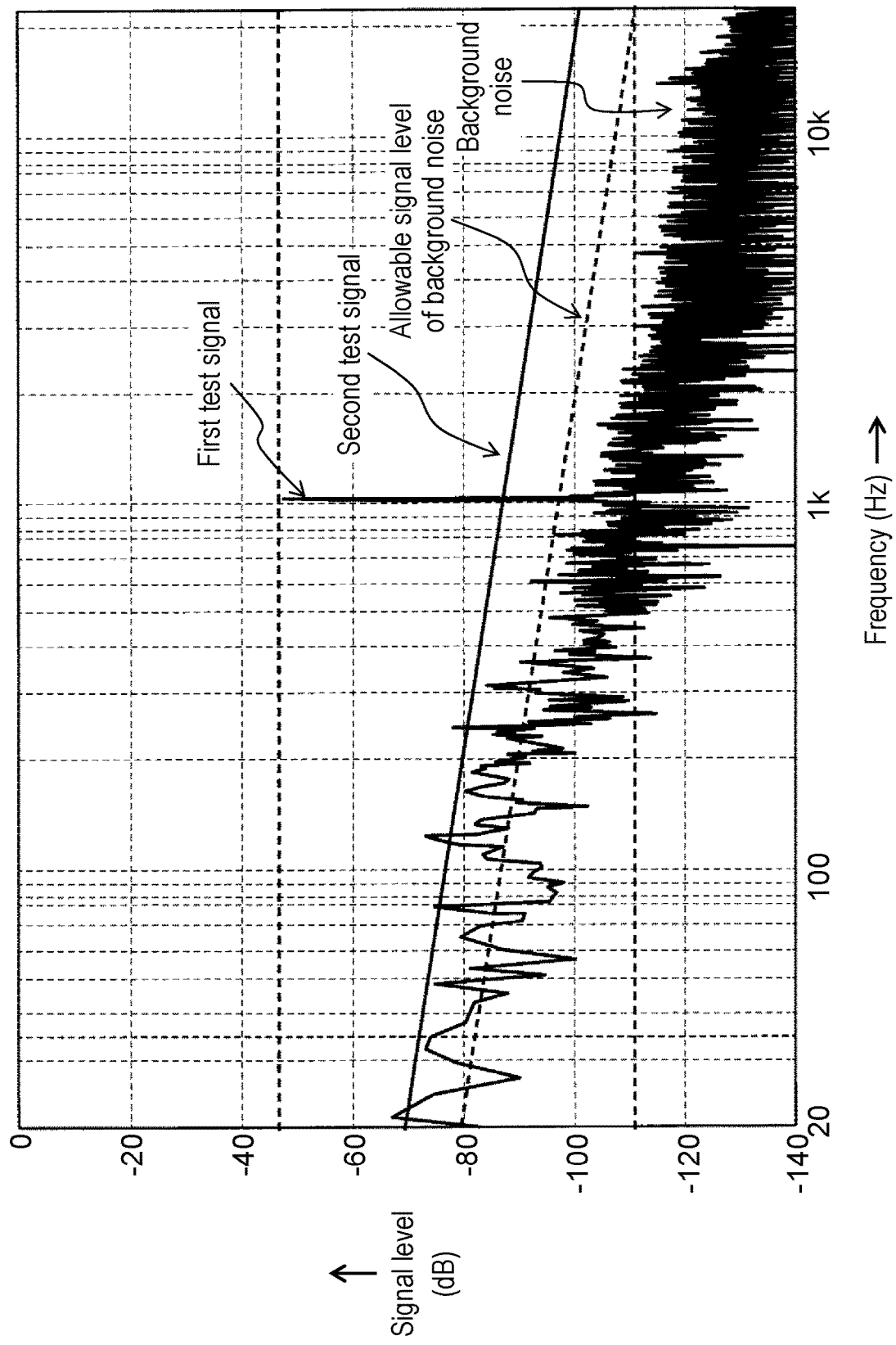
FIG. 20 is a graph illustrating an example of signal levels of the first test signal, the second test signal, and the background noise measured by the control device in the first exemplary embodiment.

FIG. 20 is a graph illustrating an example of signal levels of the first test signal, the second test signal, and the background noise measured by control device 20 in the first exemplary embodiment.

FIGS. 18 to 20 illustrate an example of signal levels of the first test signal, the second test signal, and the background noise measured using a smartphone as control device 20 and measured by a built-in microphone of the smartphone. In FIGS. 18 to 20, a vertical axis represents a signal level and a horizontal axis represents a frequency.

The signal level of the second test signal illustrated in FIG. 19 shows the measurement result of the second test signal played back with the sound volume being adjusted by the control method described in the first exemplary embodiment. FIG. 19 also illustrates a signal level of the second test signal estimated by the control method described in the first exemplary embodiment in a solid diagonal line. As is understood from the graph in FIG. 19, the estimated signal level of the second test signal is approximate to the measured signal level of the second signal. Note that the second test signal represented by a solid diagonal line in FIG. 20 is the same as the second test signal represented by the solid diagonal line in FIG. 19. In FIG. 20, an allowable signal level of background noise calculated by subtracting a predetermined measurement margin from the estimated signal level of the second test signal is represented by a broken diagonal line.

In the example illustrated in FIG. 20, the signal level of the background noise is relatively larger in a low-frequency region having relatively a low frequency than in a high-frequency region having relatively a high frequency, and a difference (margin) between the background noise and the second test signal is smaller in the low-frequency region than in the high-frequency region.

However, as illustrated in FIG. 20, the signal level of the background noise is less than the allowable signal level of the background noise at a plurality of predetermined frequencies f (for example, f=100 Hz and 10 kHz), and this shows that playback system 30 can measure frequency characteristics while reducing an influence of the background noise by playing back the second test signal with the adjusted sound volume.

As described above, playback system 30 according to the exemplary embodiment can measure the first test signal, the second test signal, and the background noise using the microphone provided to the smartphone. Through the adjustment of the playback sound volume of the second test signal by using the measured first test signal, frequency characteristics of the room can be measured with less affected by the background noise.

Measured Example 2

Figure 21:
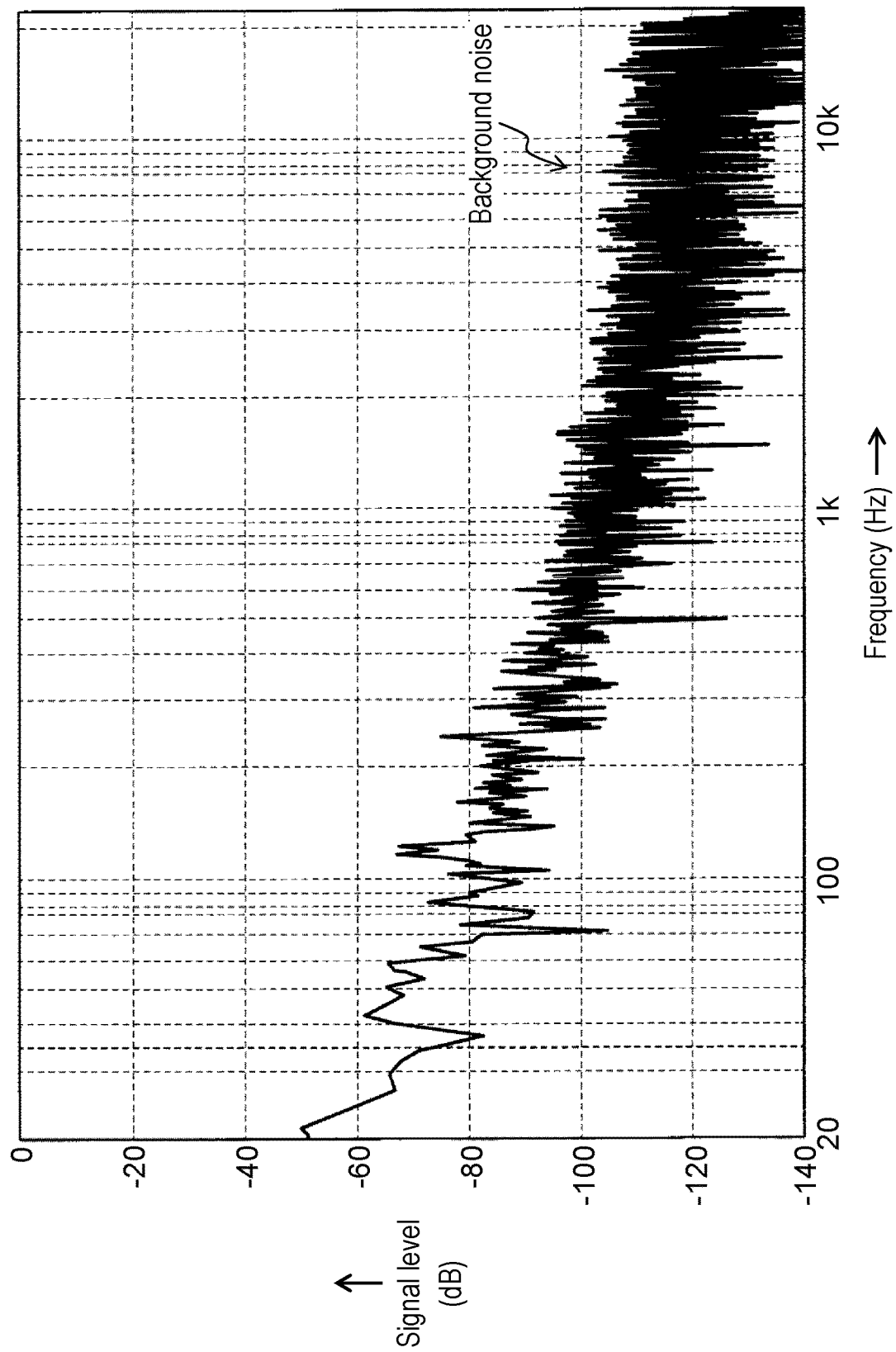
FIG. 21 is a graph illustrating another example of a signal level of background noise measured by the control device in the first exemplary embodiment.

FIG. 21 is a graph illustrating another example of a signal level of background noise measured by control device 20 in the first exemplary embodiment.

Figure 22:
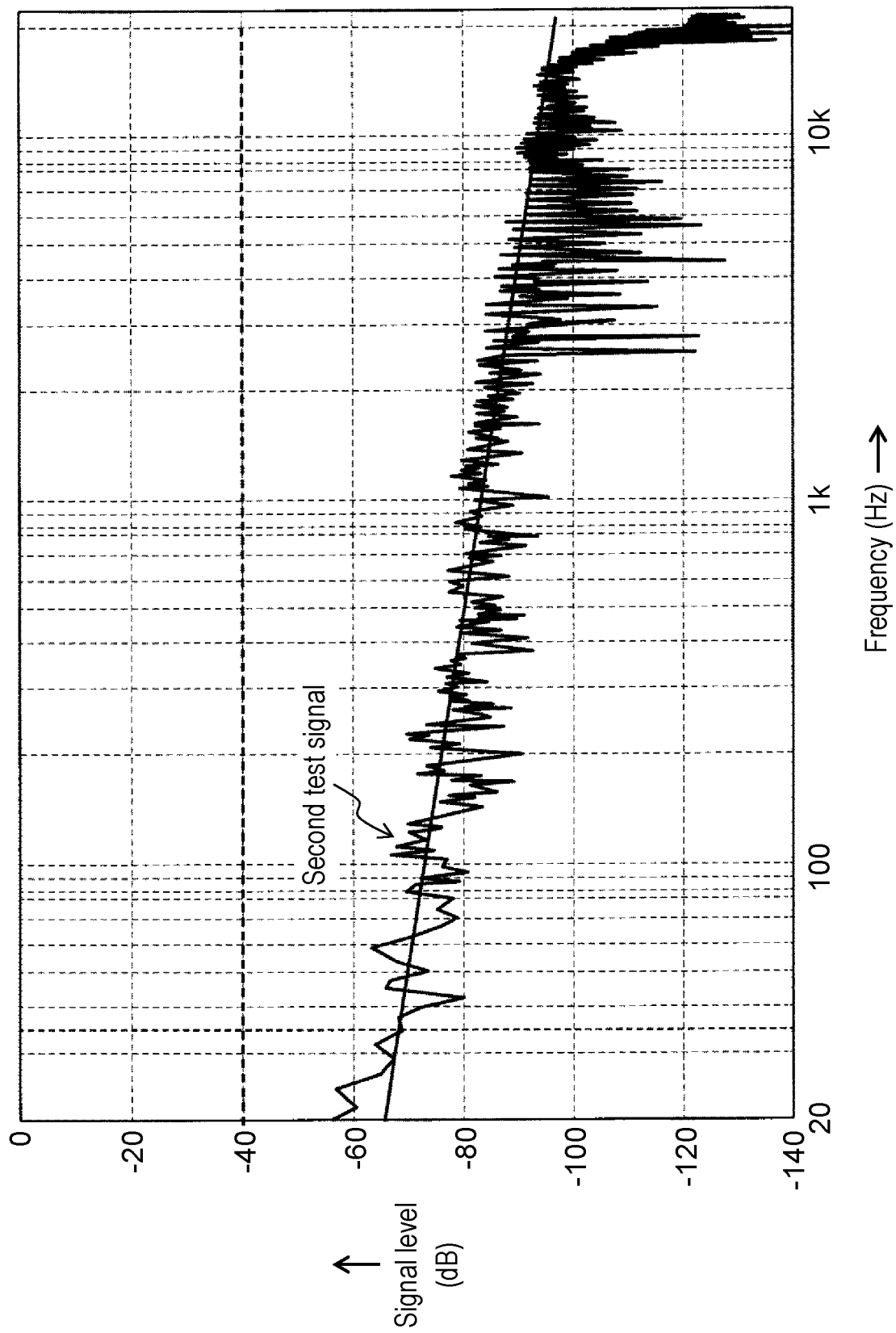
FIG. 22 is a graph illustrating another example of a signal level of the second test signal measured by the control device in the first exemplary embodiment.

FIG. 22 is a graph illustrating another example of a signal level of the second test signal measured by control device 20 in the first exemplary embodiment.

FIG. 23 is a graph illustrating another example of signal levels of the first test signal, the second test signal, and the background noise measured by control device 20 in the first exemplary embodiment.

FIGS. 21 to 23 illustrate an example of signal levels of the first test signal, the second test signal, and the background noise measured using a smartphone as control device 20 and measured by a microphone externally provided to the smartphone without using a built-in microphone of the smartphone. In FIGS. 21 to 23, a vertical axis represents a signal level and a horizontal axis represents a frequency.

The signal level of the second test signal illustrated in FIG. 22 shows the measurement result of the second test signal played back with the sound volume being adjusted by the control method described in the first exemplary embodiment. FIG. 22 also illustrates a signal level of the second test signal estimated by the control method described in the first exemplary embodiment in a solid diagonal line. As is understood from the graph in FIG. 22, the estimated signal level of the second test signal is approximate to the measured signal level of the second signal. Note that the second test signal represented by a solid diagonal line in FIG. 23 is the same as the second test signal represented by the solid diagonal line in FIG. 22. In FIG. 23, an allowable signal level of background noise calculated by subtracting a predetermined measurement margin from the estimated signal level of the second test signal is represented by a broken diagonal line.

In the example illustrated in FIG. 23, the signal level of the background noise is relatively larger in a low-frequency region having relatively a low frequency than in a high-frequency region having relatively a high frequency, and a difference (margin) between the background noise and the second test signal is smaller in the low-frequency region than in the high-frequency region.

However, as illustrated in FIG. 23, the signal level of the background noise is less than the allowable signal level of the background noise at a plurality of predetermined frequencies f (for example, f=100 Hz and 10 kHz), and this shows that playback system 30 can measure frequency characteristics while reducing an influence of the background noise by playing back the second test signal with the adjusted sound volume.

As described above, even when the microphone externally provided to the smartphone is used, playback system 30 according to the exemplary embodiment can measure the first test signal, the second test signal, and the background noise, as in the case where the built-in microphone of the smartphone is used. Through the adjustment of the playback sound volume of the second test signal by using the measured first test signal, frequency characteristics of the room can be measured with less affected by the background noise.

Other Exemplary Embodiments

The first exemplary embodiment has been described above as an example of the technique disclosed in the present application. However, the technique in the present disclosure is not limited to the above exemplary embodiment, and is also applicable to other exemplary embodiments including appropriate modifications, substitutions, additions, or omissions. In addition, new exemplary embodiments can be made by combining the constituent elements described in the first exemplary embodiment.

Accordingly, other exemplary embodiments will be described below.

In the exemplary embodiment, a flash memory is used as storage device 11 and storage device 24. However, storage device 11 and storage device 24 are not limited to the flash memory. At least one of storage device 11 and storage device 24 may be a semiconductor storage device other than the flash memory, or may be, for example, a storage device using magnetism such as a hard disk.

In the exemplary embodiment, source device 15 is described as a source of generation of a sound signal (digital sound signal) such as music. Source device 15 may be a CD drive, a hard disk drive, a drive for a detachable storage medium, or the like. Alternatively, source device 15 may be a communication circuit connected to an external sound signal generating source of playback device 10 via wired local area network (LAN), wireless LAN, Bluetooth (registered trademark), or the like.

According to the configuration example described in the exemplary embodiment, digital-to-analog converter 17 and loudspeaker 18 are directly connected to each other in playback device 10, and digital-to-analog converter 27 and loudspeaker 28 are directly connected to each other in control device 20. However, the present disclosure is not limited to this configuration. A signal amplifier may be provided between digital-to-analog converter 17 and loudspeaker 18. A signal amplifier may be provided between digital-to-analog converter 27 and loudspeaker 28.

According to the configuration example described in the first exemplary embodiment, control device 20 has display 29 integrated with a touch panel. However, the present disclosure is not limited to this configuration. Control device 20 may be provided with, in place of or in addition to the touch panel, an input device provided separately from display 29, such as a keyboard or a pointing device.

According to the configuration example described in the first exemplary embodiment, a smartphone or a tablet computer is used as control device 20. However, the present disclosure is not limited to this configuration. Control device 20 may be any general-purpose device, other than smartphones or tablet computers, which is provided with a microphone and which can communicate with playback device 10, for example. Control device 20 may be a lap-top computer, for example.

According to the configuration example described in the first exemplary embodiment, a plurality of predetermined frequencies f is two, that is, 100 Hz and 10 kHz. However, the present disclosure is not limited to this configuration. The plurality of predetermined frequencies f may be three or more frequencies different from one another, and may be frequencies other than 100 Hz or 10 kHz.

According to the configuration example described in the first exemplary embodiment, the playback time of the first test signal played back by playback device 10 is set to about five seconds. However, the present disclosure is not limited to this configuration. The playback time of the first test signal is not limited to five seconds, and it may be shorter or longer than five seconds.

According to the configuration example described in the first exemplary embodiment, the playback time of the second test signal repeatedly played back by playback device 10 is set to about ten seconds. However, the present disclosure is not limited to this configuration. The playback time of the repeatedly played back second test signal is not limited to ten seconds, and it may be shorter or longer than ten seconds.

Control device 20 may be provided with a buffer memory (not illustrated). When recording the second test signal by executing step S52 in FIG. 11, processor 23 in control device 20 may temporarily store the second test signal to be recorded into the buffer memory in order to prevent interruption of the recording operation.

When executing the correction coefficient setting process in step S5, processor 23 in control device 20 may display, in display 29, graphs similar to the graphs illustrated in FIGS. 16 and 17 to confirm user 102 whether user 102 intends to correct the frequency characteristics of playback device 10. Processor 23 in control device 20 may determine whether the correction coefficient is set to playback device 10 according to an input operation performed by user 102 in response to the confirmation, such as an input operation performed by user 102 using the touch panel of display 29. Processor 23 in control device 20 may change the correction coefficient based on the input operation performed by user 102.

When executing step S76 in FIG. 12, processor 23 in control device 20 may display, in display 29, a message for confirming user 102 whether user 102 intends to set again the tone control. Processor 23 in control device 20 may determine whether the tone control is set again to playback device 10 according to an input operation performed by user 102 in response to the confirmation, such as an input operation performed by user 102 using the touch panel of display 29.

In a smartphone or a tablet computer, at least one of a method for mounting a microphone and performance of the microphone may differ according to the model. Therefore, there may be a difference in measured frequency characteristics according to the model of a smartphone or a tablet computer used as control device 20 in playback system 30. Such a difference may be acquired in advance as correction data according to the model of the smartphone or tablet computer. When playback system 30 measures frequency characteristics, processor 23 in control device 20 may execute a process for convoluting correction data of the model of control device 20 on the second test signal acquired through microphone 25 and correct the frequency characteristics of microphone 25.

The acoustic correction process described with reference to FIGS. 6 to 17 may be implemented in control device 20 as an acoustic correction program executed by processor 23 in control device 20. The acoustic correction program may be a part of a control program entirely controlling playback device 10. The acoustic correction program may be provided as application software for a smartphone or a tablet computer.

According to the configuration example described in the exemplary embodiment, a LOG-TSP signal is used as the second test signal. However, the present disclosure is not limited to this configuration. The second test signal may be a signal which has a plurality of frequency components and with which an impulse response of the room can be measured. For example, the second test signal may be an impulse signal or white noise.

According to the configuration example described in the exemplary embodiment, loudspeaker 18 is provided outside playback device 10 in FIG. 1. However, the present disclosure is not limited to this configuration. Loudspeaker 18 may be integrated with playback device 10.

According to the configuration example described in the exemplary embodiment, playback system 30 is configured such that control device 20 calculates a sound volume when the second test signal is played back through loudspeaker 18. However, the present disclosure is not limited to this configuration. For example, playback system 30 may be configured such that the first test signal acquired by control device 20 or signal level T1 of the first test signal acquired by control device 20 is transmitted to playback device 10 from control device 20, and playback device 10 calculates a sound volume when the second test signal is played back through loudspeaker 18.

According to the configuration example described in the exemplary embodiment, playback system 30 is configured such that control device 20 measures the frequency characteristics of the room and calculates a correction coefficient of frequency characteristics to be set to playback device 10. However, the present disclosure is not limited to this configuration. For example, playback system 30 may be configured such that the second test signal acquired by control device 20 or the signal level of the second test signal acquired by control device 20 is transmitted to playback device 10 from control device 20, and playback device 10 calculates a correction coefficient of frequency characteristics to be set to playback device 10.

According to the configuration example described in the exemplary embodiment, playback system 30 is installed in a room and frequency characteristics of the room are measured. However, the place where playback system 30 is used is not limited to the interior of a house. Playback system 30 can also be used in, for example, a space in a vehicle, a ship, a train, an airplane, or the like.

In the exemplary embodiment, how functional blocks are divided in each of the block diagrams is merely an example. For example, a plurality of functional blocks may be implemented as one functional block, one functional block may be divided into a plurality of functional blocks, or a part of the functions may be transferred to another functional block. The functions of a plurality of functional blocks may be processed in parallel or in a time-sharing manner by single piece of hardware or software.

The software program for causing processor 23 in control device 20 to execute the control method described in the exemplary embodiment may be recorded in a recording medium (for example, an optical disk, a magnetic disk, a magnetic tape, or a semiconductor memory) readable by a computer or a control device, and distributed or put into circulation. Alternatively, the software program may be transmitted through, for example, a telecommunication line, a wireless or wired communication line, a network such as the Internet, and data broadcasting. Alternatively, another stand-alone computer system may execute the software program to execute various pieces of processing.

Further, computer-readable recording media in which the software program is recorded are included in the scope of the present disclosure.

Examples of such computer-readable recording media include: flexible disks; hard disks; compact disk read-only memories (CD-ROMs); magneto-optical disks (MOs); digital versatile disks (DVDs); DVD-ROMs; DVD-RAMs; Blu-ray (registered trademark) discs (BDs); and semiconductor memories.

A part or all of the constituent elements constituting the above-described devices may be configured with an integrated circuit (IC) card detachable from each of the devices, or a single module.

A part or all of the components constituting the above-described devices may be configured with a single-chip large scale integration (LSI).

Each processor is not limited to the LSI or the IC, but may be configured with a dedicated circuit or a general-purpose processor. Alternatively, each processor may be constructed with a field programmable gate array (FPGA) in which a circuit configuration can be programmed or a reconfigurable processor that can reconfigure connection and setting of circuit cells in the LSI.

An execution order of each step in the flowcharts illustrated in the drawings in the exemplary embodiments is merely an example. The steps may be executed in order different from the orders described in the exemplary embodiments. Furthermore, some of the above steps may be executed simultaneously (in parallel) with the other steps.

The exemplary embodiments have been described above as examples of the technique in the present disclosure. For that purpose, the accompanying drawings and detailed descriptions have been provided.

Accordingly, the components described in the accompanying drawings and the detailed description may include not only the components essential for solving the problem but also components that are not essential for solving the problem in order to illustrate the technique. It should not be therefore determined that the unessential constituent elements in the accompanying drawings and the detailed description are essential only based on the fact that these constituent elements are included in the drawings and the description.

The above exemplary embodiments are provided to exemplify the technique according to the present disclosure, and various changes, replacements, additions, omissions, and the like can be made within the scope of the claims and equivalents thereof.

INDUSTRIAL APPLICABILITY

The present disclosure is applicable to a playback system, a control device, a control method, and a program with which frequency characteristics of a room are measured and based on the results frequency characteristics of a sound to be played back by a playback device are corrected. Specifically, the present disclosure is applicable to audio devices for home use, digital television sets, hard disk recorders, optical disk playback devices, AV amplifiers, set-top boxes, in-vehicle audio devices, smartphones, tablet computers, lap-top computers, or other portable terminal devices.

REFERENCE MARKS IN THE DRAWINGS 10 playback device
11 storage device
12 processor
13 communication circuit
14 antenna
15 source device
16 DSP
17 digital-to-analog converter
18 loudspeaker
20 control device
21 antenna
22 communication circuit
23 processor
24 storage device
25 microphone
26 analog-to-digital converter
27 digital-to-analog converter
28 loudspeaker
29 display
30 playback system
100 room
101 loudspeaker
102 user
103 wall
104 furniture

The invention claimed is:

1. A control device that controls frequency characteristics of a playback device connected to or integrated with a loudspeaker installed in a room, the control device comprising:
   a first communication circuit that communicates with the playback device;
   a microphone that acquires a sound signal generated through the loudspeaker; and
   a first control circuit,
   wherein the first control circuit:
   acquires background noise in the room through the microphone and calculates a signal level of the background noise at a plurality of predetermined frequencies;
   transmits, to the playback device via the first communication circuit, a first control signal directing playback of a first test signal having a predetermined sound volume through the loudspeaker;
   acquires the first test signal through the microphone and calculates a signal level of the acquired first test signal;
   estimates a signal level of a second test signal having a predetermined sound volume and predetermined frequency characteristics at the plurality of predetermined frequencies using the signal level of the first test signal as a reference;
   increases a set value of the sound volume of the second test signal when a signal level obtained by subtracting a predetermined value from the estimated signal level of the second test signal is less than or equal to the signal level of the background noise in at least one of the plurality of predetermined frequencies;
   transmits, to the playback device via the first communication circuit, a second control signal directing playback of the second test signal having a sound volume corresponding to the set value through the loudspeaker;
   acquires the second test signal through the microphone, calculates a frequency response of the room based on the acquired second test signal, and calculates a correction coefficient of frequency characteristics to be set to the playback device based on the calculated frequency response of the room; and
   transmits, to the playback device via the first communication circuit, a third control signal including the correction coefficient of the frequency characteristics to be set to the playback device.

2. The control device according to claim 1, wherein the first control circuit decreases the set value of the sound volume of the second test signal when the signal level of the acquired first test signal exceeds a predetermined threshold.

3. The control device according to claim 1, wherein the first test signal is a sine wave.

4. The control device according to claim 1, wherein the second test signal is a log-time stretched pulse (LOG-TSP) signal.

5. The control device according to claim 1, wherein the control device is a smartphone or a tablet computer.

6. A playback system that includes a playback device connected to or integrated with a loudspeaker installed in a room, and the control device according to claim 1, the playback device comprising:
   a second communication circuit that communicates with the control device;
   a signal processing circuit having variable frequency characteristics; and
   a second control circuit, wherein the second control circuit:
plays back the first test signal through the loudspeaker in response to the first control signal received from the control device via the second communication circuit,
plays back the second test signal through the loudspeaker in response to the second control signal received from the control device via the second communication circuit, and
corrects the frequency characteristics of the signal processing circuit in response to the third control signal received from the control device via the second communication circuit.

7. A control method for controlling frequency characteristics of a playback device that is connected to or integrated with a loudspeaker installed in a room using a control device provided outside the playback device, the control device including:
a first communication circuit that communicates with the playback device;
a microphone that acquires a sound signal generated through the loudspeaker; and
a first control circuit,
the control method comprising:
acquiring background noise in the room through the microphone and calculating a signal level of the background noise at a plurality of predetermined frequencies;
transmitting, to the playback device via the first communication circuit, a first control signal directing playback of a first test signal having a predetermined sound volume through the loudspeaker;
acquiring the first test signal through the microphone and calculating a signal level of the acquired first test signal;
estimating a signal level of a second test signal having a predetermined sound volume and predetermined frequency characteristics at the plurality of predetermined frequencies using the signal level of the first test signal as a reference;
increasing a set value of the sound volume of the second test signal when a signal level obtained by subtracting a predetermined value from the estimated signal level of the second test signal is less than or equal to the signal level of the background noise in at least one of the plurality of predetermined frequencies;
transmitting, to the playback device via the first communication circuit, a second control signal directing playback of the second test signal having a sound volume corresponding to the set value through the loudspeaker;
acquiring the second test signal through the microphone, calculating a frequency response of the room based on the acquired second test signal, and calculating a correction coefficient of frequency characteristics to be set to the playback device based on the calculated frequency response of the room; and
transmitting, to the playback device via the first communication circuit, a third control signal including the correction coefficient of the frequency characteristics to be set to the playback device.

8. A non-transitory computer-readable recording medium storing a program to be executed by a control device that controls frequency characteristics of a playback device connected to or integrated with a loudspeaker installed in a room for performing control processing, the control device including:
a first communication circuit that communicates with the playback device;
a microphone that acquires a sound signal generated through the loudspeaker; and
a first control circuit that executes the program,
the control processing comprising:
acquiring background noise in the room through the microphone and calculating a signal level of the background noise at a plurality of predetermined frequencies;
transmitting, to the playback device via the first communication circuit, a first control signal directing playback of a first test signal having a predetermined sound volume through the loudspeaker;
acquiring the first test signal through the microphone and calculating a signal level of the acquired first test signal;
estimating a signal level of a second test signal having a predetermined sound volume and predetermined frequency characteristics at the plurality of predetermined frequencies using the signal level of the first test signal as a reference;
increasing a set value of the sound volume of the second test signal when a signal level obtained by subtracting a predetermined value from the estimated signal level of the second test signal is less than or equal to the signal level of the background noise in at least one of the plurality of predetermined frequencies;
transmitting, to the playback device via the first communication circuit, a second control signal directing playback of the second test signal having a sound volume corresponding to the set value through the loudspeaker;
acquiring the second test signal through the microphone, calculating a frequency response of the room based on the acquired second test signal, and calculating a correction coefficient of frequency characteristics to be set to the playback device based on the calculated frequency response of the room; and
transmitting, to the playback device via the first communication circuit, a third control signal including the correction coefficient of the frequency characteristics to be set to the playback device.

* * * * *